(12) United States Patent
Sen et al.

(10) Patent No.: US 12,719,487 B2
(45) Date of Patent: Aug. 25, 2026

(54) SWITCHED CAPACITOR CIRCUITRY AND SUB-RANGING ADC

(71) Applicant: Infineon Technologies Austria AG, Villach (AT)

(72) Inventors: Sujata Sen, Marina Del Rey, CA (US); Luca Petruzzi, El Segundo, CA (US)

(73) Assignee: Infineon Technologies Austria AG, Villach (AT)

( * ) Notice: Subject to any disclaimer, the term of this patent is extended or adjusted under 35 U.S.C. 154(b) by 72 days.

(21) Appl. No.: 18/636,645

(22) Filed: Apr. 16, 2024

(65) Prior Publication Data

US 2025/0323655 A1 Oct. 16, 2025

(51) Int. Cl.
*H03M 1/10* (2006.01)

(52) U.S. Cl.
CPC ....... *H03M 1/1028* (2013.01); *H03M 1/1071* (2013.01)

(58) Field of Classification Search
CPC .......................... H03M 1/1028; H03M 1/1071
USPC ................. 341/155, 144, 172, 120, 118, 143
See application file for complete search history.

(56) References Cited

U.S. PATENT DOCUMENTS

2005/0151677 A1* 7/2005 Chou .................. H03M 1/0682 341/122
2010/0182183 A1* 7/2010 Oo .......................... H03M 1/14 341/156
2011/0175666 A1* 7/2011 Ballenegger ........ H03F 3/45753 327/337

* cited by examiner

*Primary Examiner* — Peguy Jean Pierre
(74) *Attorney, Agent, or Firm* — Armis IP Law, LLC

(57) ABSTRACT

An apparatus as discussed herein can be configured to include a first analog-to-digital converter operative to convert a first analog voltage into a first digital signal; a digital-to-analog converter operative to convert the first digital signal into a second analog voltage; a switched capacitor circuit coupled to the digital-to-analog converter, the switched capacitor circuit is operative to store a sample of the second analog voltage; and a second analog-to-digital converter operative to convert an analog error voltage into a second digital signal, the analog error voltage based on a difference between the sample of the second analog voltage received from the switched capacitor circuit and a sample of the first analog voltage.

24 Claims, 20 Drawing Sheets

DOUT[N-1:X]
N22
277
156
MUX-OUT
MUX SELECT LOGIC 275
155
DOUT[N-1]
DOUT[N-2]
DOUT[X]
DOUT[X-1]
DOUT[X-2]
DOUT[1]
DOUT[0]
C(N-1)
C-X
C2
C1
VIN
VREF<N>
VREF<N-1>
VREF<N/2>
VREF<1>
VREF<0>
293
REF
TL(N-1)
TL(N-2)
VIN_CM + VGAIN_TP
VIN_CM
TLX
TL1
REF3
TL0
A11
A12
A13
VREF_MAX
VIN_CM_BIAS
VREF_MIN

CHANNEL 0

WHEN SWITCH CLK_MUX_SAMPLE IS OPEN &
CLK_VIN_SAMPLE IS OPEN

QINITIAL1 = C*(VIN - VIN_CM)

QTOTAL = C[(VIN - VIN_CM) - (VMUX - VIN_CM)] = C(VIN - VMUX)

VINP_DLFLASH - VINN_DLFLASH = (QINITIAL1 - QINITIAL 2)/C = VIN - VMUX $$tpn(Vg) := \frac{\frac{Cl}{\frac{Kn}{2}\cdot\frac{Wd}{Ld}}}{\sqrt{\frac{(Wn\cdot Ln)}{(Ld\cdot Wd)}}\cdot(Vg - Vt)}\cdot \operatorname{atan}\left(\frac{\left(\frac{Vdd}{2}\cdot\sqrt{\frac{(Wn\cdot Ln)}{(Ld\cdot Wd)}}\cdot(Vg - Vt)\right)}{\frac{(Wn\cdot Ln)}{Ld\cdot Wd}\cdot(Vg - Vt)^2 + \left(\frac{Vdd}{2} - Vt\right)\cdot(Vdd - Vt)}\right)$$

$$y(x) := \frac{d}{dx}tpn(x)$$

$$tpn(0.6) - tpn(0.4) = -8.951\cdot 10^{-10}$$

SWITCHED CAPACITOR CIRCUITRY AND SUB-RANGING ADC

BACKGROUND

A conventional sub ranging ADC (analog-to-digital converter) works by having a first ADC1 (analog-to-digital converter) coarsely digitize an input signal Vin. The output of the first ADC1 is converted into an analog signal by a DAC (digital to analog converter). Via one or more amplifier circuits, the output of the DAC is subtracted from the input voltage to create the residue signal inputted to a second stage ADC2. The second stage analog-to-digital converter ADC2 has fine resolution and digitizes the residue signal to create the lower bits for the output of the overall ADC signal. For an N bit sub-ranging ADC, ADC1 is an (N−1-x) bit ADC which generates the upper bits for the overall ADC (N−1:x) while the ADC2 is an x−1 bit ADC which generates the lower bits (x−1:0) of the overall ADC output.

Thus, a conventional sub-ranging analog-to-digital converter implements one or more amplifiers to produce a respective error voltage based on the output of the DAC.

BRIEF DESCRIPTION

Implementation of clean energy (or green technology) is very important to reduce human impact on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator or voltage source.

Regardless of whether energy is received from green energy sources or non-green energy sources, it is desirable to make most efficient use of raw energy (such as storage and subsequent distribution) provided by such sources to reduce our impact on the environment. This disclosure contributes to reducing our carbon footprint and providing better use of energy via more efficient energy conversion. Energy conversion may include implementation of one or more analog-to-digital converter circuits.

More specifically, an apparatus or system as discussed herein includes: i) a switched capacitor circuit including multiple switches and multiple capacitors; and ii) a controller operative to, via control of the multiple switches: i) store a sample of an analog input voltage (such as with respect to a common mode voltage) in a first capacitor of the multiple capacitors, the analog input voltage inputted to a first analog-to-digital converter circuit; ii) store a sample of a first reference voltage (such as with respect to it the common mode voltage) associated with the first analog-to-digital converter circuit in a second capacitor of the multiple capacitors; and iii) derive an analog error voltage from the sample of the analog input voltage in the first capacitor and the sample of the reference voltage in the second capacitor.

The first analog-to-digital converter can be configured to convert the analog input voltage into a first digital signal via implementation of multiple reference voltages. The digital-to-analog converter can be coupled between the first analog-to-digital converter and the switched capacitor circuit. The digital-to-analog converter can be configured to select the first reference voltage from amongst the multiple reference voltages. The first digital signal represents a magnitude of the analog input voltage; and the first reference voltage is selected from amongst the multiple reference voltages for storage in the second capacitor depending on a magnitude of the first digital signal.

In accordance with further examples as discussed herein, the controller can be configured to, via control of the multiple switches, output an analog error voltage from the switched capacitor circuit to a second analog-to-digital converter circuit. In such an instance, the second analog-to-digital converter circuit can be configured to include: delay line analog-to-digital converter circuitry; a signal generator circuit coupled to the delay line analog-to-digital converter circuit, the signal generator circuit operative to produce control signals to control operation of the delay line analog-to-digital converter circuit based upon the analog error voltage received by the signal generator circuit; and calibration circuitry operative to produce calibration signals to calibrate the signal generator circuit. The calibration signals can be configured include an offset calibration adjustment signal and a gain calibration adjustment signal; the calibration circuitry can be configured to include an offset calibration circuit operative to generate the offset calibration adjustment signal based on monitoring the control signals produced by the signal generator circuit. The calibration circuit can be configured to include gain calibration circuitry operative to generate the gain calibration adjustment signal based on monitoring an output of the delay line analog-to-digital converter circuit.

In accordance with still further examples, the first analog-to-digital converter can be configured to convert the analog input voltage into a first digital signal, the first digital signal representing a magnitude of the analog input voltage; the controller can be configured to, via control of the multiple switches in the switched capacitor circuit, output the analog error voltage from the switched capacitor circuit to a second analog-to-digital converter circuit. The second analog-to-digital converter can be configured to convert the analog error voltage received from the switched capacitor circuit into a second digital signal, the second digital signal representing a magnitude of the received analog error voltage. A signal converter can be configured to generate a third digital signal based on a combination of a first set of set of bits selected from the first digital signal and a second set of bits selected from the second digital signal; the third digital signal represents a magnitude of the analog input voltage.

In accordance with another example, the second analog-to-digital converter can be configured to include a delay line analog-to-digital converter controlled via a voltage to time converter. The voltage to time converter may be configured to generate control signals to control the delay line analog-to-digital converter based upon a magnitude of the analog error voltage.

In still further examples, the controller can be configured to, via control of the multiple switches, generate the analog error voltage via control of the multiple switches connecting the first capacitor and the second capacitor in series. The control of the multiple switches may connect the first capacitor and the second capacitor in series. This cancels a common mode voltage associated with both the stored sample of the analog input voltage and the stored sample of the first reference voltage.

Still further, connection of the first capacitor and the second capacitor in series may include directly coupling a first node of the first capacitor to a first node of the second capacitor; the analog error voltage may be a first differential voltage across a second node of the first capacitor and a second node of the second capacitor.

Another example as discussed herein includes a multiplexer circuit operative to select amongst multiple differential input signals to convey to a second analog-to-digital converter circuit. The multiple differential input signals may include: i) a first differential input signal, the first differential input signal being the analog error voltage; ii) a second differential input signal, the second differential input signal being an offset calibration signal to calibrate at least the second analog-to-digital converter circuit, the offset calibration signal generated by the first analog-to-digital converter circuit; and iii) a third differential input signal, the third differential input signal being a gain calibration signal calibrate at least the second analog-to-digital converter circuit, the gain calibration signal generated by the first analog-to-digital converter circuit. The benefit of using the reference signals such as offset calibration signal and the gain calibration signal generated by the first analog-to-digital converter circuit is that such reference signals scale with the errors from the first ADC and the sampling of the first ADC by the capacitors. Accordingly, the second ADC is calibrated to the errors of the first ADC and the sampling error and hence does not need any separate calibration. Also, in such an instance, there is no need for a buffer amplifier as an intermediate step due to removal of the sampling error.

Note further that the multiple capacitors as discussed herein may include a third capacitor, a fourth capacitor, a fifth capacitor, and a sixth capacitor. The controller can be configured to, via control of the multiple switches, generate the offset calibration signal via control of the multiple switches connecting the third capacitor and the fourth capacitor in series. Further, the controller can be configured to, via control of the multiple switches, generate the gain calibration signal via control of the multiple switches connecting the fifth capacitor and the sixth capacitor in series.

Yet another example as discussed herein includes an apparatus comprising: a first analog-to-digital converter operative to convert a first analog voltage into a first digital signal; a digital-to-analog converter operative to convert the first digital signal into a second analog voltage; a switched capacitor circuit coupled to the digital-to-analog converter, the switched capacitor operative to store a sample of the second analog voltage; and a second analog-to-digital converter operative to convert an analog error voltage into a second digital signal, the analog error voltage based on a difference between the sample of the second analog voltage received from the switched capacitor circuit and a sample of the first analog voltage.

In one example, the digital-to-analog converter is a so-called ranging digital-to-analog converter operative to select one of multiple reference values as the sample of the second analog voltage. The sample of the second analog voltage may be stored in a first capacitor of the multiple capacitors.

Note further that the apparatus may include a converter function operative to: receive a first portion of bits from the first digital signal; receive a second portion of bits from the second digital signal; and derive an output digital signal from a combination of the first portion of bits and the second portion of bits, the output digital signal indicating a magnitude of the first analog voltage.

Still further, the second analog-to-digital converter may be a delay line analog-to-digital converter circuit.

Yet further examples as discussed herein include: storing a sample of an analog input voltage in a first capacitor of multiple capacitors of a switched capacitor circuit including multiple switches and multiple capacitors, the analog input voltage inputted to a first analog-to-digital converter circuit; storing a sample of a first reference voltage associated with the first analog-to-digital converter circuit in a second capacitor of the multiple capacitors, the first reference voltage being one of multiple reference voltages associated with the first analog-to-digital converter circuit; and deriving an analog error voltage from the sample of the analog input voltage and the sample of the reference voltage.

These and other more specific examples are disclosed in more detail below.

As discussed herein, techniques herein are well suited for use in the field of analog-to-digital conversion. However, it should be noted that examples herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of examples herein (BRIEF DESCRIPTION OF EXAMPLES) purposefully does not specify every example and/or incrementally novel aspect of the present disclosure or claimed invention(s). Instead, this brief description only presents general examples and corresponding points of novelty over conventional techniques. For additional details and/or possible perspectives (permutations) of the invention(s), the reader is directed to the Detailed Description section (which is a summary of examples) and corresponding figures of the present disclosure as further discussed below.

Figure 1:
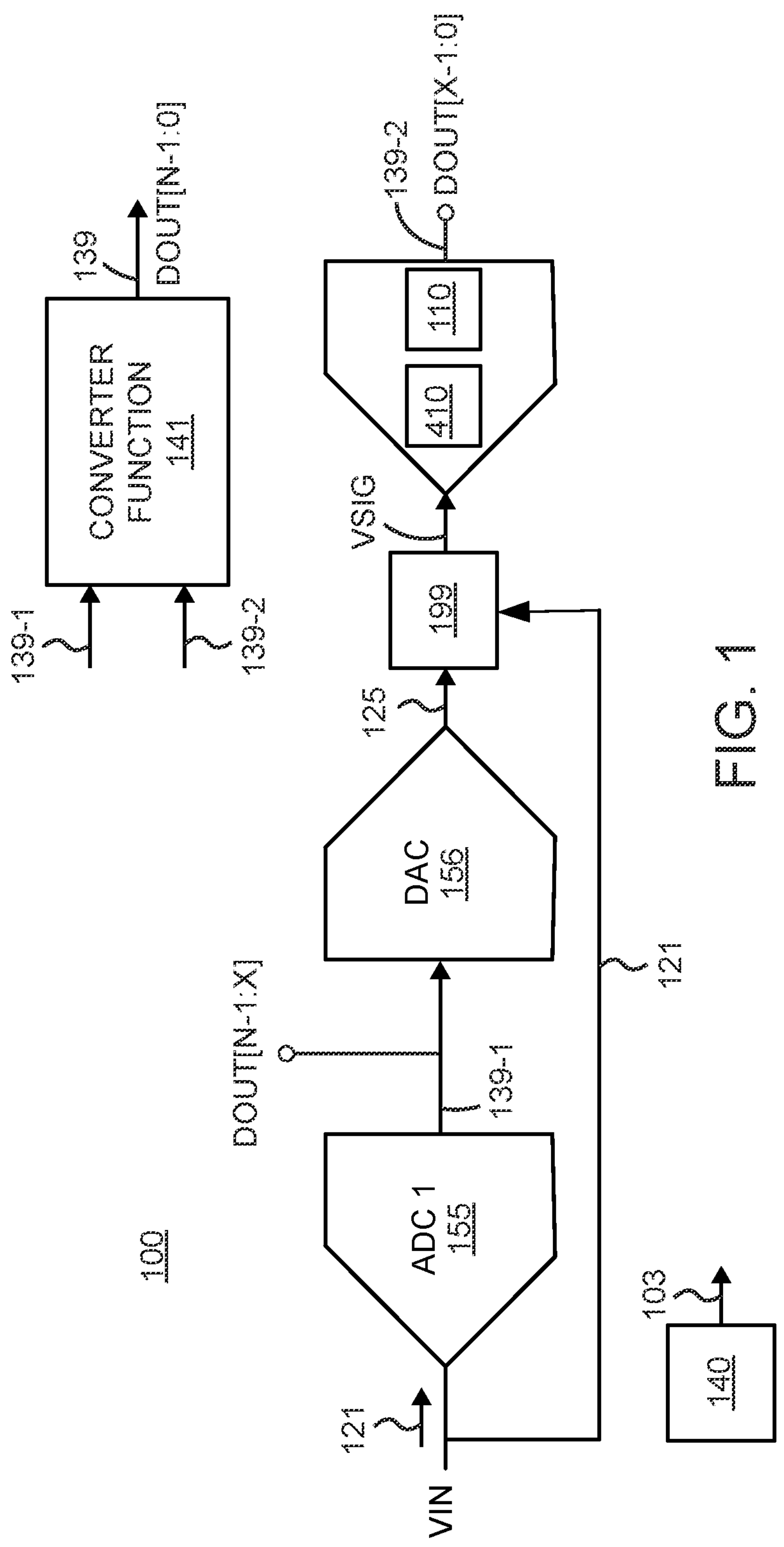
FIG. 1 is an example diagram of a sub-ranging ADC system as discussed herein.

The foregoing and other objects, features, and advantages of the invention will be apparent from the following more particular description of preferred examples herein, as illustrated in the accompanying drawings in which like reference characters refer to the same parts throughout the different views. The drawings are not necessarily to scale, with emphasis instead being placed upon illustrating the examples, principles, concepts, etc.

DETAILED DESCRIPTION

The main advantage of a DLFLASH as the 2nd stage ADC as discussed herein is that: The DLFLASH used as the 2nd ADC stage in a sub ranging ADC has the unique advantage of not requiring a buffer amplifier to connect ADC1 output to ADC2 input due to the gain DLL which adjusts the gain of the DLFLASH to not only the gain error of the 1st stage but also the charge loss from connecting the sampling capacitors.

Unique Features Summary

1. The DLFLASH used as an error quantizer for a tracking ADC maximizes the tracking loop bandwidth due to very low input impedance.
   a. The low input impedance is created due to minimum device sizing of the VTC input differential pair [transistors Mp1 and Mp2 in FIG. 7] which is made possible due to removal of the large mismatch (generated by small devices) by the offset calibrating DLL loop
2. LLC current sensing: the Voltage Regulator controller needs to detect when the current crosses zero-requires the quantizer to have a very low offset
   a. Tracking loop with delay line flash has low offset due to calibration loops
   b. Delay line has larger visibility around the zero crossing due to redundant flip-flops in top and bottom delay line which were designed with a negative setup time.
3. Due to the gain calibration DLL, the gain of the DLFLASH can match the gain of the outer tracking ADC. The reference signals which are used to conduct the gain calibration are generated from the tracking loop to match the gain of the two ADC transfer functions
4. The DLFLASH ADC is self-calibrated over lifetime and temperature due to the unique shuffling where the DLFLASH calibrates its own internal error while the outer tracking loop is settling.
5. The charge pump and PFD are designed to equivalently have an ideal charge pump/PFD with no internal errors which is necessary in order to avoid need of over range and trim for the DLFLASH which means that signals are converted in the minimum amount of time due to fixed number of cells.
6. The DLFLASH used as the 2nd ADC stage in a sub ranging ADC has the unique advantage of not requiring a buffer amplifier to connect ADC1 output to ADC2 input due to the gain DLL which adjusts the gain of the DLFLASH to not only the gain error of the 1st stage but also the charge loss from connecting the sampling capacitors.

Now, more specifically, FIG. 1 is an example general diagram illustrating a sub-ranging ADC implementing a delay line ADC or other suitable type of ADC as discussed herein.

As shown, the analog-to-digital converter system 100 includes analog-to-digital converter 155, digital to analog converter 156, switched capacitor circuit 199, and the analog-to-digital converter circuitry 157. The analog-to-digital converter circuitry 157 includes voltage selection function 410 and corresponding delay line analog-to-digital converter circuit 110. The controller 140 associated with the system 100 generates the control signals 103 to control operation of analog-to-digital converter system 100.

In this example, the sub-ranging analog-to-digital converter system 100 receives the analog input voltage 121 and converts it (such as via the converter function 141) into a respective digital output signal 139 such as based on a combination of digital output signal 139-1 including upper data bits Dout[N−1:x] and digital output signal 139-2 including lower data bits Dout[x−1:0]. In other words, the overall digital signal Dout[N−1:0] represents a magnitude of the input voltage 121. Accordingly, the sub-ranging analog-to-digital converter system 100 as discussed herein converts the analog input voltage 121 into the corresponding digital output signal 139 (such as Dout[N−1:0]).

More specifically, the sub-ranging ADC system 100 as discussed herein works by having a 1st ADC 155 coarsely digitize the input signal such as the analog input voltage 121 into the upper data bits Dout[N−1:x]. Further in this example, the lower bits of the digital signal outputted by the analog-to-digital converter 155 is converted into an analog signal 125 by the digital to analog converter 156. Via the switched capacitor circuit 199, the output analog signal 125 (analog voltage) of the digital analog converter 156 can be subtracted from the analog input voltage 121 to create the residue signal VSIG supplied to the analog-to-digital converter circuit 156. The analog-to-digital converter circuit 156 provides fine resolution processing and digitizes the residue signal VSIG to create the digital signal 139-2 such as the lower data bits for the digital output signal 139 of the analog-to-digital converter circuitry 100.

Thus, for an N bit ADC, the analog-to-digital converter 155 (a.k.a., ADC1) is an (N−1-x) bit ADC which generates the upper bits for the overall ADC (N−1:x) while the ADC2 is an x bit ADC which generates the lower bits (x−1:0) of the overall ADC output such as digital signal 139 representing the magnitude of the analog input voltage 121.

As further discussed herein, a so-called DLFLASH analog-to-digital converter (110) can be included in the second stage of the sub ranging ADC system 100 with the following advantages:

- Not necessary to have an amplification buffer (amplifier circuitry) between the DAC 156 and ADC2 157 due to the gain calibration DLL loop
- No overrange needed for trim of the ADC2 which minimizes the conversion time. As further discussed herein, the signal selector 410 can be used to select the signal VSIG from amongst other signals such as reference voltages VR1 to correct offset errors associated with the analog-to-digital converter circuitry 100 and reference voltages VR2 and VR3 to correct gain errors associated with the analog-to-digital converter circuitry 100.

As previously discussed, in this example, the system 100 as shown in FIG. 1 converts the input voltage signal 121 (such as an analog input voltage signal) into a respective digital output signal 139. The digital output signal 139 tracks a magnitude of the input voltage signal 121.

Thus, as shown in FIG. 1, the apparatus such as the sub-ranging analog-to-digital converter system 100 can be configured to include a first analog-to-digital converter 155 operative to convert a first analog voltage 121 into a first digital signal such as the data bits Dout[N−1:0] of the digital signal 139-1. The digital-to-analog converter 156 receives data bits Dout[x−1:0] and is operative to convert this first digital signal into a second analog voltage 125. As previously discussed, the switched capacitor circuit 199 is coupled to the digital-to-analog converter 156.

If desired, the second analog-to-digital converter 156 includes or is a delay line analog-to-digital converter circuit.

As further discussed herein, the switched capacitor circuit 199 can be configured to store a sample of the second analog voltage (125). In one example, the switched capacitor circuit 199 generates the signal VSIG such as analog error voltage based on a difference between the sample of the second analog voltage (125) received from the switched capacitor circuit 199 and a sample of the first analog input voltage 121. The second analog-to-digital converter 156 is operative to convert the analog error voltage such as signal VSIG into a second digital signal (139-2), which may include data bits Dout[x−1:0].

In accordance with further examples as discussed herein, the digital-to-analog converter circuit 156 is a ranging digital-to-analog converter operative to select one of multiple reference values from the analog-to-digital converter circuit 155 to produce the sample of the second analog voltage 125 (vsig). As further discussed herein, the sample of the second analog voltage 125 (with respect to the common mode voltage) supplied to the switched capacitor circuit 199 can be stored in a first capacitor C01 of the multiple capacitors in the switched capacitor circuit 199.

Note further that the output of the analog-to-digital converter circuit 155 and the digital output of the analog-to-digital converter circuit 156 can be encoded in accordance with a thermometer code. As previously discussed, the analog-to-digital converter system 100 can be further configured to include a converter function 141. The converter function 141 receives: i) digital signal 139-1 such as a first portion of data bits Dout[N−1:x] from the digital signal outputted from the analog-to-digital converter 155, and ii) digital signal 139-2 such as a second portion of data bits Dout[x−1:0] from the digital signal 139-2 outputted from the analog-to-digital converter 157. The converter function 141 can be configured to derive an output digital signal 139 (in any suitable encoding format) from a combination of the first portion of bits and the second portion of bits, the output digital signal 139 indicating a magnitude of the first analog voltage 121.

Figure 2A:
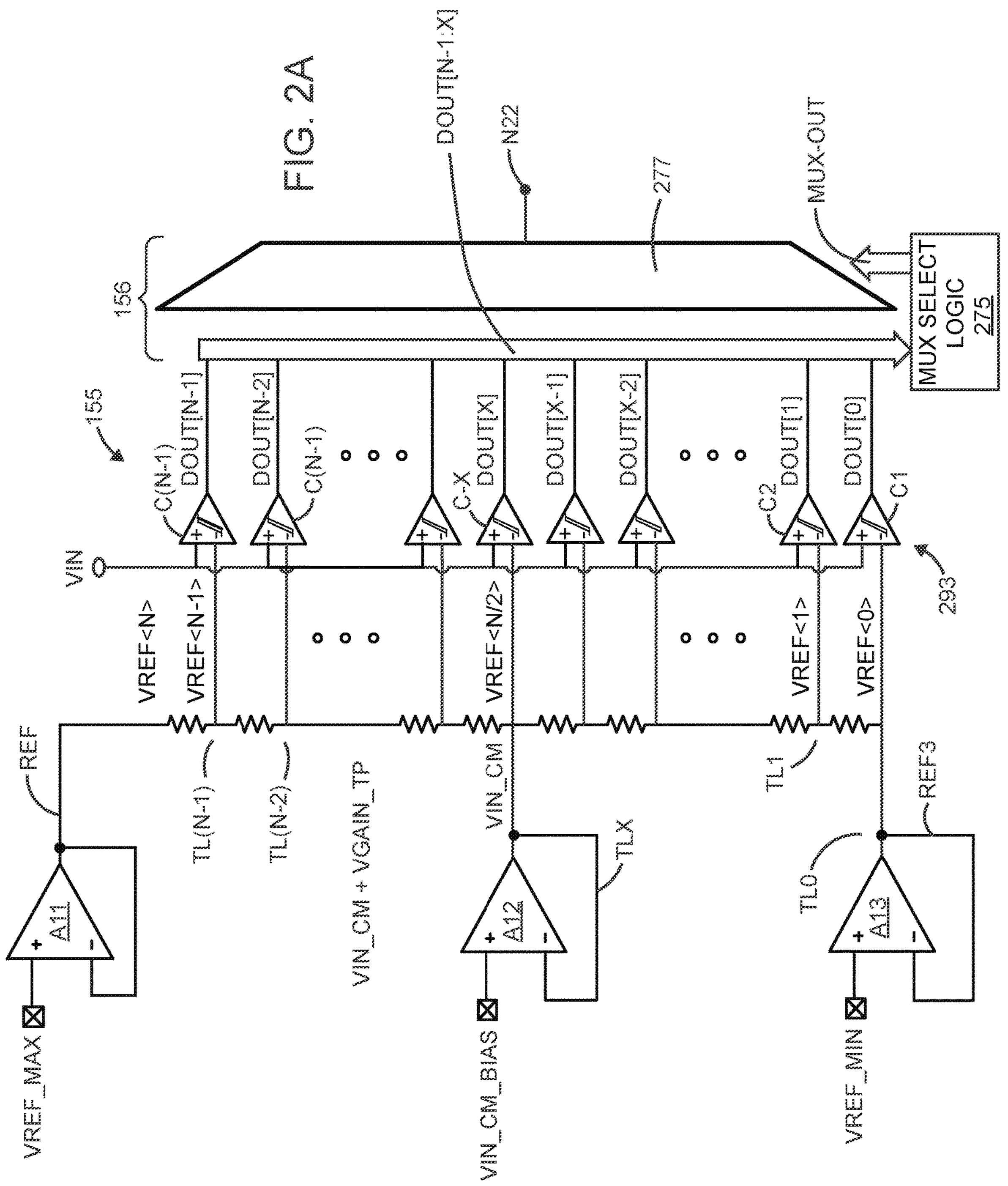
FIGS. 2A, 2B, and 2C are example diagrams illustrating a more detailed sub-ranging ADC system including calibration circuitry as discussed herein.
Figure 2B:
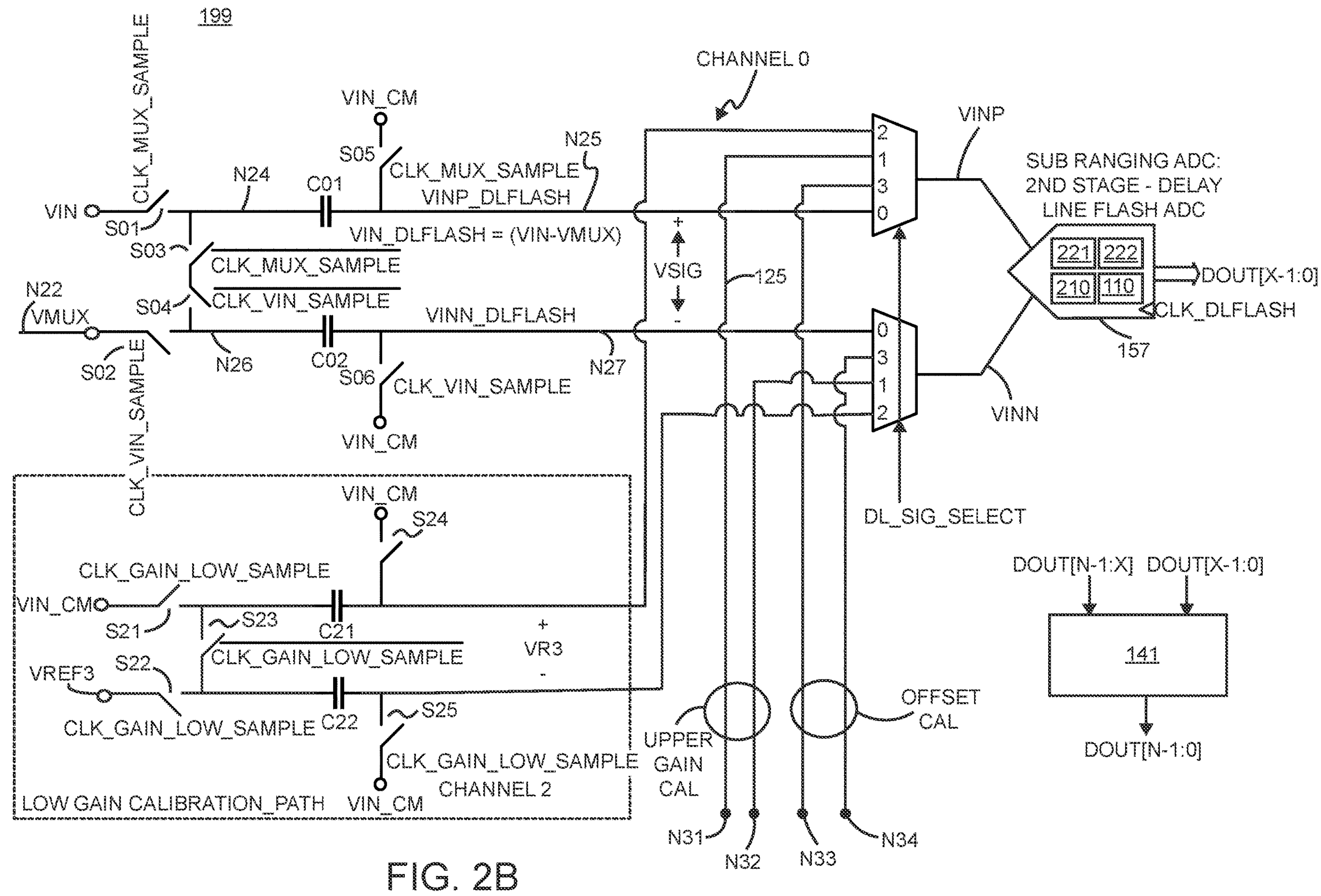
Figure 2C:
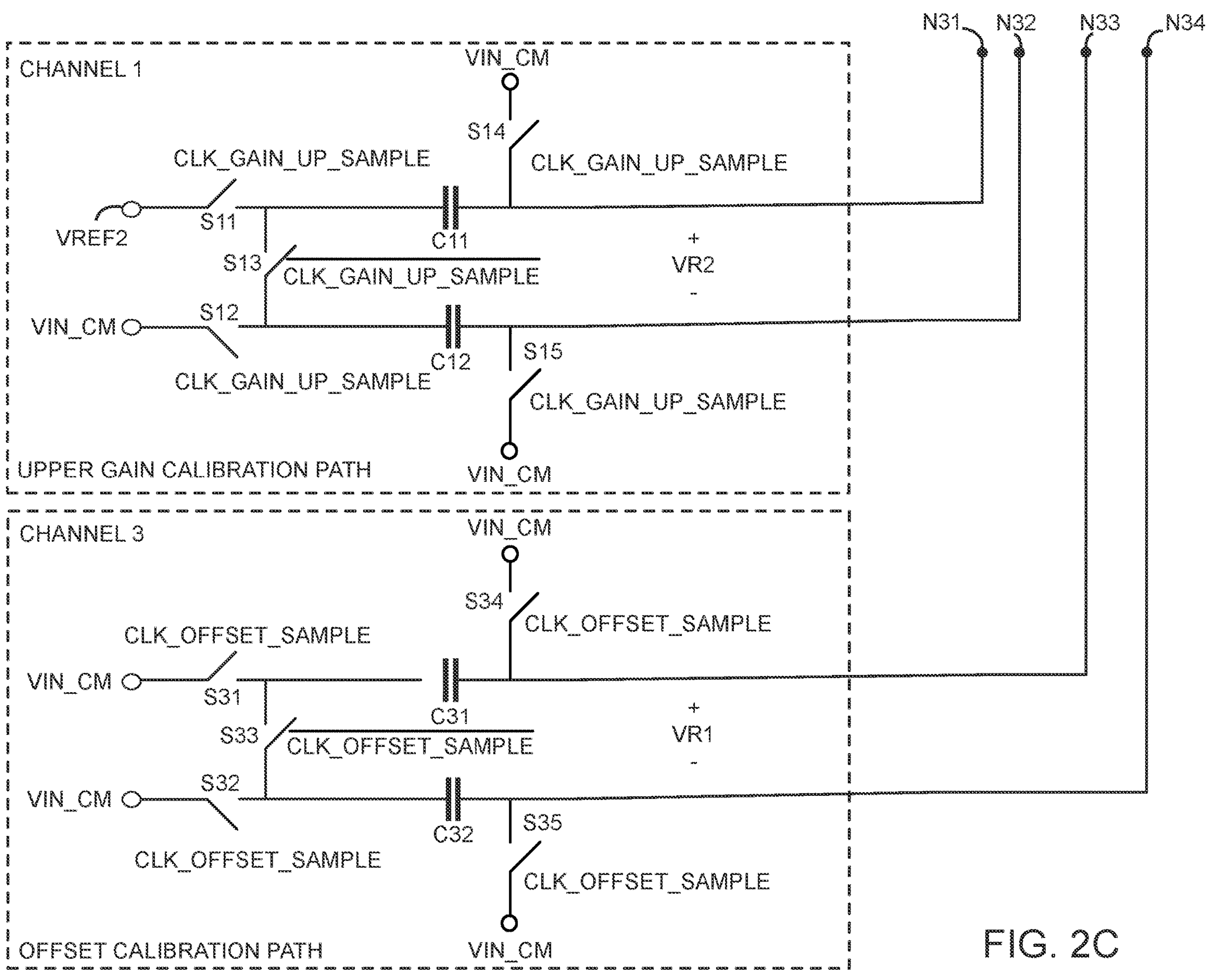

FIGS. 2A, 2B, and 2C are example diagrams illustrating an ADC circuit implementing calibration functionality as discussed herein.

Figure 2D:
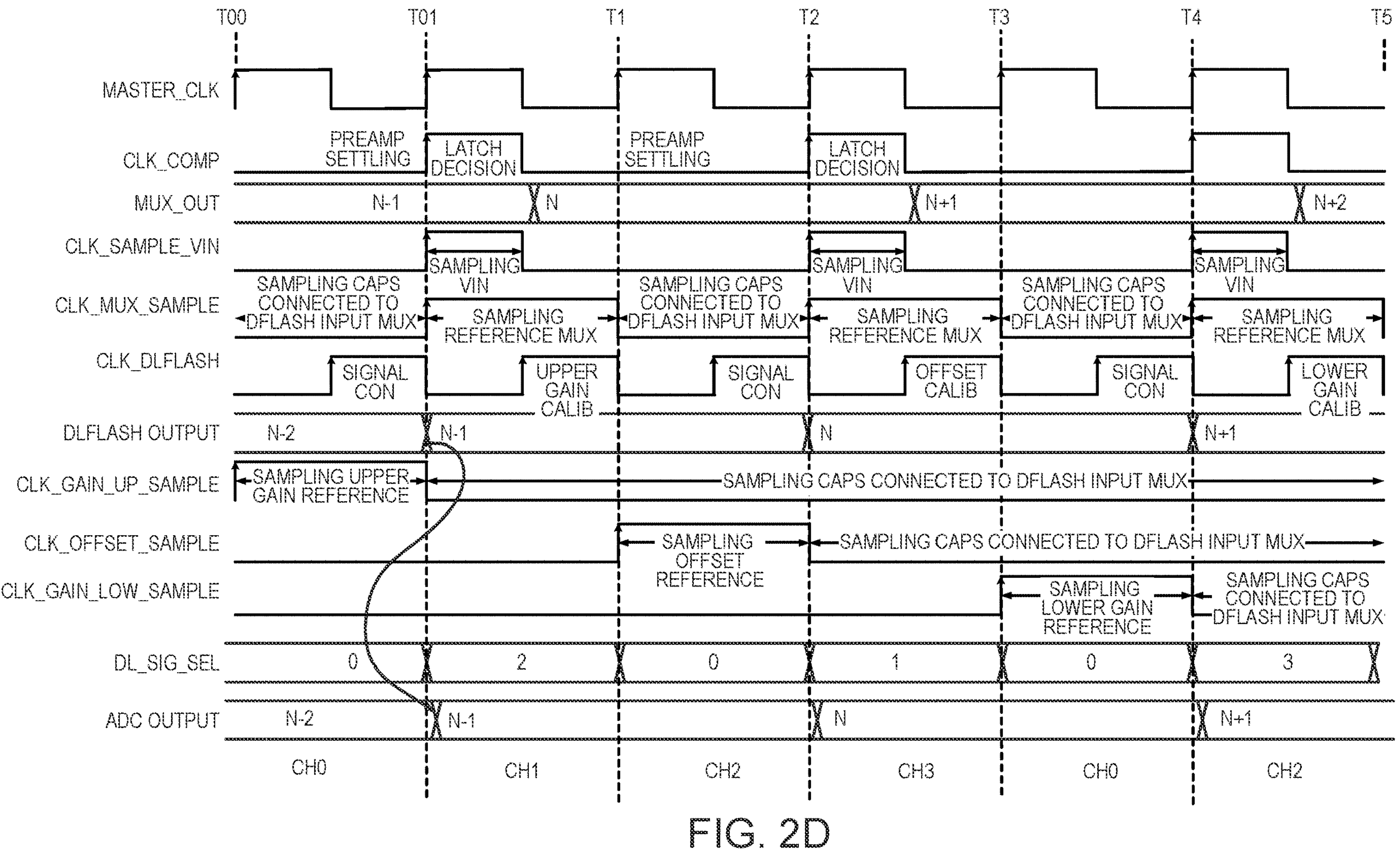
FIG. 2D is an example timing diagram illustrating implementation of a sub-ranging ADC system discussed herein.

FIG. 2D is an example timing diagram illustrating implementation of a sub-ranging ADC system discussed herein.

Note that the following discussion references always FIGS.

In this example, the DLADC (delay line analog-to-digital converter circuitry 157) can be used in a sub-ranging style ADC design as an effective 2nd stage (analog-to-digital converter circuitry 157) due to the DLL (Delay Lock Loop) such as calibration circuitry 222 which calibrates the gain of the overall circuit from the input receiving the input voltage 121 to the output producing the signal Dout[N−1:0]. Capacitor C02 stores samples of the mux output such as signal Vmux at node N22 as received from the 1st stage digital-to-analog converter 156; capacitor C01 stores a sample of the input voltage 121 (Vin).

During a respective analog-to-digital conversion, as further discussed herein, the capacitors C01 and C02 are connected in series to subtract the mux output Vmux (such as stored in the capacitor C02) from Vin (such as sample stored in capacitor C01) to feed into the selector 410 on channel 0, which is forwarded to the nodes vinp and vinn of the analog-to-digital converter circuitry 157 (a.k.a., DFLASH) for conversion into a respective digital output signal.

Due to the low impedance of the DLFLASH as discussed herein, the charge sharing loss can be minimized when it is connected to the sampling capacitors C01 and C02.

As previously discussed, conventional techniques may include an amplifier circuit to subtract the first stage mux output vmux from the sample Vin voltage to generate the input for the DLFLASH (157) due to charge sharing losses. The advantage of the DLFLASH and corresponding switched capacitor circuit 199 in this topology as described herein as an alternative to conventional circuitry is that the offset calibration circuitry 221 and the gain calibration circuitry 222 calibrate the DLFLASH gain to the references generated form the 1st stage. The reference voltages associated with the analog-to-digital converter system 100 as discussed herein scale to the gain error of the 1st stage ADC. In addition, since the reference voltages are also sampled by capacitors and connected to the DLFLASH input; the charge sharing losses are also compensated for by the DLFLASH.

As further discussed herein, the system 100 can be configured to include 4 sets of sampling capacitors. One set (such as capacitors C01 and C02) is for sampling the input voltage and mux output voltage. One set (such as capacitors C23 and C24) is for sampling the lower gain calibration reference value from the 1st ADC. One set (such as capacitors C11 and C12) is for sampling the upper gain calibration reference value from the 1st ADC. The 4th set (such as capacitors C41 and C42) is for sampling the common mode voltage for offset calibration. Since all reference voltages are generated from ADC1, the ADC2 (DLFLASH) can be configured to calibrate and scale itself to the combination of ADC1 gain and charge sharing losses from the above sampling capacitors.

More specifically, as shown in FIG. 2A and with reference to other FIGS., the analog-to-digital converter circuit 155 includes buffer amplifier A11, buffer amplifier A12, and buffer amplifier A13.

The buffer amplifier A11 receives the reference voltage Vref_max and produces corresponding reference voltage vref[N] or REF1 (a.k.a., threshold level TL(N)). The buffer amplifier A12 receives the reference voltage vin_cm_bias and produces corresponding reference voltage vin_cm (a.k.a., threshold level TL(x)). The buffer amplifier A13 receives the reference voltage vref_min and produces corresponding reference voltage REF3 (a.k.a., threshold level TL(0) or vref[0]).

The analog-to-digital converter circuit 155 further includes a respective series resistor ladder (each resistor in the ladder being roughly the same resistance) connected between the output of the buffer amplifier A11 producing the reference voltage REF1 and the output of the buffer amplifier A13 producing the reference voltage REF3. The buffer amplifier A12 produces the respective reference voltage vin_cm applied to the resistor ladder.

Note that the different voltages (vref_max, vin_cm_bias, vref_min) as discussed herein can be set to any suitable value.

As further shown, the analog-to-digital converter circuit 155 includes multiple comparators 293. Each of the comparators 293 compares a magnitude of the received input voltage 121 to a corresponding threshold level received by the comparator from the resistor ladder.

For example, the comparator C(N−1) compares the received input voltage 121 to the corresponding reference voltage TL(N−1) (a.k.a., reference voltage vref[n−1]) to produce the corresponding (comparator output) bit value Dout[N−1]; the comparator C(N−2) compares the received input voltage 121 to the corresponding reference voltage TL(N−2) (a.k.a., reference voltage vref[n−2]) to produce the corresponding (comparator output) bit value Dout [N−2]; . . . ; the comparator C(x) compares the received input voltage 121 to the corresponding reference voltage TL [x] (a.k.a., vin_cm or half the magnitude of the reference voltage REF1 or other suitable magnitude of voltage) to produce the corresponding (comparator output) bit value Dout[x]; . . . ; the comparator C(1) compares the received input voltage 121 to the corresponding reference voltage TL(1) (a.k.a., reference voltage vref[1]) to produce the corresponding (comparator output) bit value Dout[1]; the comparator C(0) compares the received input voltage 121 to the corresponding reference voltage TL(0) (a.k.a., reference voltage vref[0]) to produce the corresponding (comparator output) bit value Dout[0].

Accordingly, the analog-to-digital converter 155 receives the input voltage 121 and converts it into a respective digital output signal 139-1 including data bits Dout[N−1:0]. In one example, the digital output signal 139-1 is encoded in accordance with a thermometer code.

The analog-to-digital converter 155 further includes the mux select logic 275. The mux select logic 275 receives the digital output signal Dout[N−1:0] and uses this signal to produce signal mux_out supplied to the reference selection multiplexer 277.

More specifically, as its name suggests, the mux select logic 275 selects one of the multiple reference voltages (such as vref[n−1], vref[n−2], . . . , vref[x], . . . ; vref[0], inputted to the comparators 293 as a basis in which to apply to the corresponding node N22 (outputting the selected reference voltage as signal vmux). Accordingly, the digital to analog converter 156 converts the received digital signal and outputs one of the reference voltages TL(N−1), TL(N−2), . . . , TL(x), . . . , TL(1), or TL(0), for application to the node N22.

The switched capacitor circuit 199 includes 4 channels in which to store sample signals for selection by the selector circuit 410. The selector circuit 410 outputs the selected one of the multiple channels in corresponding differential sample voltage to the input (vinp and vinn) of the analog-to-digital converter circuitry 157.

For example, the analog-to-digital converter system 100 (such as a so-called sub ranging ADC) can be configured to include a switched capacitor circuit 199. The switched capacitor circuit 199 includes including multiple switches and multiple capacitors as previously discussed.

In this example, during operation, the controller 140 generates respective one or more control signals 103 to control the multiple switches in the switched capacitor circuit 199. See example of the control signals in FIG. 2D and FIG. 9 for channel 0 conversion.

For example, for Channel 0 conversion (such as between time T1 and time T2, between time T3 and time T4, etc.), the controller 140 controls the switches S01 and S05 to be in an on state via the signal clk_mux_sample. During such time, switch S03 is open via clk_mux_sample*(in version of clk_mux_sample). Thus, for channel 0 conversion, this causes a sample of the input voltage 121 (vin) with respect to the common mode voltage (vin_cm) to be stored in the first capacitor C01. Additionally, for Channel 0 conversion (such as between time T1 and time T2, between time T3 and time T4, etc.), the controller 140 controls switches S02 and S06 to be in an on state between time T1 time T2 via the signal clk_vin_sample (a.k.a., clk_sample_vin). This causes the sample of the signal vmux (one of multiple selected reference voltages associated with the analog-to-digital converter 155 with respect to the common mode voltage vin_cm) received at node N22 and node N27 to be stored in the capacitor C02. Thereafter, after sampling the signal vmux with respect to the common mode voltage (vin_cm), the controller 140 opens the corresponding switches S01, S02, S05, and S06. The controller 140 closes (turns on) the switches S03 and S04 to derive an analog error voltage (vsig) inputted to the selector circuit 410 on channel 0. For example, turning on the switches S03 and S04 causes the capacitors C01 and capacitor C02 to be connected in series. The error voltage (vsig) on the series connected capacitors is thus derived from the sample of the analog input voltage 121 stored in the capacitor C01 and the sample of the reference voltage (vmux) stored in the capacitor C02.

Thus, the controller 140 is operative to, via control of the multiple switches in the switched capacitor circuit 199, generate the analog error voltage (such as signal visg) via control of the multiple switches connecting the first capacitor C01 and the second capacitor C02 in series.

Note that the series connection of the capacitor C01 and C02 results in canceling of the common mode voltage Vin_cm from the generated signal Vsig. In other words, the signal Vsig is basically an analog voltage representing a difference between the sample input voltage 121 and the sample signal vmux (such as reference voltage outputted as signal 125 from the digital analog converter 156). Accordingly, connection of the first capacitor C01 and the second capacitor C02 in series includes directly coupling a first node N24 of the first capacitor C01 to a first node N26 of the second capacitor C02. The analog error voltage 125 (such as vsig across node N25 and node N27) for conversion is a first differential voltage across a second node N25 of the first capacitor C01 and a second node N27 of the second capacitor C02.

Selector circuit 410 receives a respective input signal generated by the controller 140. The input signal such as dl_sig_select controls which of multiple channels are processed (for an analog-to-digital conversion) by the analog-to-digital converter circuitry 157.

For example, selection of the channel 0 causes the signal vsig (first differential signal such as representative of the analog error voltage 125) to pass through the selector circuit 410 and be applied across the node vinp and node vinn of the analog-to-digital converter circuitry 157. For example, when the channel 0 selected, the voltage at node N25 is applied to the input vinp of the analog-to-digital converter circuitry 157; the voltage at node N27 is applied to the input vinn of the analog-to-digital converter circuitry 157.

Accordingly, the first analog-to-digital converter 155 is operative to convert the analog input voltage 121 into a first digital signal 139 via implementation of multiple reference voltages inputted to comparators 293. The digital-to-analog converter 156 is coupled between the first analog-to-digital converter 155 and the switched capacitor circuit 199; the multiplexer selection logic 275 associated with the digital-to-analog converter 156 is operative to select a first reference voltage from amongst the multiple reference voltages to output from the node N22 as signal vmux. The first digital signal 139 represents a magnitude of the analog input voltage 121; the first reference voltage outputted as signal vmux is selected from amongst the multiple reference voltages for storage in the capacitor C01 depending on a magnitude of the first digital signal 139.

In one example as further discussed herein, the second analog-to-digital converter circuit 110 (and the second stage or analog-to-digital converter circuitry 157) is a delay line analog-to-digital converter controlled via a voltage inputted to the voltage to time converter 210; the voltage to time converter 210 is operative to generate control signals to control the delay line analog-to-digital converter circuitry 110 based upon a magnitude of the analog error voltage as indicated by the signal vsig 125.

As previously discussed, the analog-to-digital converter system 100 can be configured to include converter function 141. In one example, the converter function is a signal converter operative to generate a digital signal Dout[N−1:0] based on a combination of a first set of set of bits Dout[N−1:x] selected from the first digital signal 139 and a second set of bits Dout[x−1:0] selected from the second digital signal outputted from the analog-to-digital converter circuit 157. The digital signal Dout[N−1:0] represents a magnitude of the analog input voltage 121.

Additionally, the multiple capacitors in the switched capacitor circuit 199 include capacitors C21 and C22 associated with channel #2 to produce a respective lower gain sample voltage to calibrate the analog-to-digital circuitry 157. For example, to perform a channel #2 calibration, the system as discussed herein uses the voltage VREF3 (such as any suitable reference voltage such as −4 mV, −16 mV, etc., or any reference voltage supplied by the analog-to-digital converter circuit 155) by conveying the corresponding derived the voltage VR3 through the selector circuit 410 to the analog-to-digital converter circuitry 157, between time duration T3 and time T4. To produce the reference voltage VR3, between time duration T3 and time T4, the controller 140 sets the signal clk_gain_low_sample to a respective logic high resulting in activation of the switches S21, S22, S24, and S25 to an on state (short circuit). At the same time, between time T3 and time T4, the switch S23 is open (open circuit) via the controller 140 driving the switch S23 with the signal clk_gain_low_sample*(inversion of signal clk_gain_low_sample). This stores a corresponding sample voltage in the capacitor C21 and a sample voltage in the capacitor C22. After storing sample voltages the capacitors, between time T4 and time T5, the controller 140 generates the corresponding control signal clk_gain_low_sample to be a logic low to open the switches S21, S22, S24, S25, and close the switch S23. Closing the switch S23 and opening of the other switches associated with the channel #2 causes the capacitor C21 and the capacitor C22 to be connected in series to produce the respective differential sample voltage VR3 supplied through the selector circuit 410 to the input vinp and vinn of the analog-to-digital converter circuitry 157. In such an instance, the series connection of capacitors C21 and C22 associated with channel #2 supply a respective lower gain sample voltage VR3 to calibrate the analog-to-digital circuitry 157. In other words, selection or implementation of the channel 2 causes the signal VR3 such as an offset calibration signal to pass through the selector circuit 410 and be applied across the node vinp and node vinn of the analog-to-digital converter circuitry 157 for calibrating the lower gain associated with the analog-to-digital converter circuitry 157. Note that calibration using samples of the VR3 signals is further discussed below.

The multiple capacitors in the switched capacitor circuit 199 further include capacitors C11 and C12 associated with channel #1 to produce a respective upper gain sample voltage to calibrate the analog-to-digital circuitry 157. For example, to perform a channel #1 conversion using the reference voltage VR2 such as derived from the reference voltage VREF2 (such as any suitable reference voltage such as +4 mV, +16 mV, etc., or any reference voltage supplied by the analog-to-digital converter circuit 155), between time duration T00 and time T0, the controller 140 sets the signal clk_gain_up_sample to a respective logic high resulting in activation of the switches S11, S12, S14, and S15 to an on state. At the same time, between time T00 and time T0, the switch S13 is open via the controller 140 driving the switch S13 with the signal clk_gain_up_sample*(inversion of signal clk_gain_up_sample). This stores a sample voltage in the capacitor C11 and a sample voltage in the capacitor C12. After storing sample voltages in respective capacitors, between time T0 and time T1, the controller 140 generates the corresponding control signal clk_gain_up_sample to be a logic low to open the switches S11, S12, S14, S15, and close the switch S13. Closing the switch S13 and opening of the other switches associated with the channel #1 causes the capacitor C11 and the capacitor C12 to be connected in series to produce the respective differential sample voltage VR2 supplied through the selector circuit 410 to the input vinp and vinn of the analog-to-digital converter circuitry 157. In such an instance, the series connection of capacitors C11 and C12 associated with channel #1 supply a respective upper gain sample voltage VR2 to calibrate the analog-to-digital circuitry 157. In other words, selection or implementation of the channel 1 causes the generation of the signal VR2 such as an upper gain calibration signal to pass through the selector circuit 410 and be applied across the node vinp and node vinn of the analog-to-digital converter circuitry 157 for upper gain calibration of the analog-to-digital converter circuitry 157.

The multiple capacitors in the switched capacitor circuit 199 further include capacitors C31 and C32 associated with channel #3 to produce a respective offset calibration voltage to calibrate the analog-to-digital circuitry 157. For example, to perform a channel #3 calibration using the reference voltage VR1 such as derived from the reference voltage VREF1 (such as any suitable reference voltage such as vin_cm, or any reference voltage supplied by the analog-to-digital converter circuit 155), between time duration T1 and time T2, the controller 140 sets the signal clk_offset_sample to a respective logic high resulting in activation of the switches S31, S32, S34, and S35 to an on state. At the same time, between time T1 and time T2, the switch S33 is open via the controller 140 driving the switch S33 with the signal clk_offset_sample*(inversion of signal clk_offset_sample). This stores a sample voltage in the capacitor C31 and a sample voltage in the capacitor C32. After storing sample voltages in respective capacitors, between time T2 and time T3, the controller 140 generates the corresponding control signal clk_offset_sample to be a logic low to open the switches S31, S32, S34, S35, and close the switch S33. Closing the switch S33 and opening of the other switches associated with the channel #3 causes the capacitor C31 and the capacitor C32 to be connected in series to produce the respective differential sample voltage VR1 supplied through the selector circuit 410 to the input vinp and vinn of the analog-to-digital converter circuitry 157. In such an instance, the series connection of capacitors C31 and C32 associated with channel #3 supply a respective offset sample voltage VR1 to calibrate the analog-to-digital circuitry 157. In other words, selection or implementation of the channel 3 causes the signal VR1 such as an offset calibration signal VR1 to pass through the selector circuit 410 and be applied across the node vinp and node vinn of the analog-to-digital converter circuitry 157 for offset calibration of the analog-to-digital converter circuitry 157.

Figure 3A:
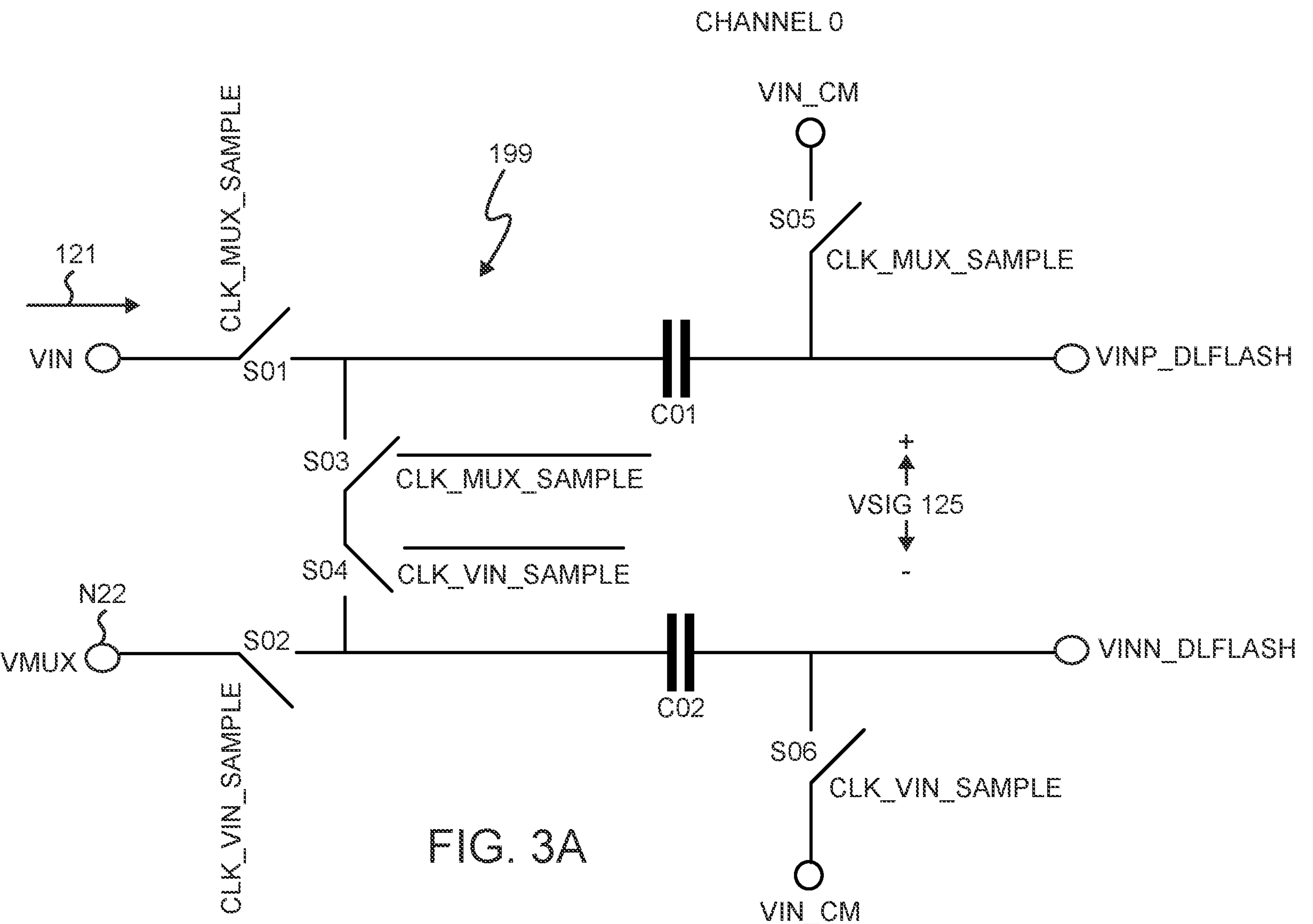
FIGS. 3A, 3B, and 3C, are example diagrams illustrating implementation of a switched capacitor circuit as discussed herein.
Figure 3B:
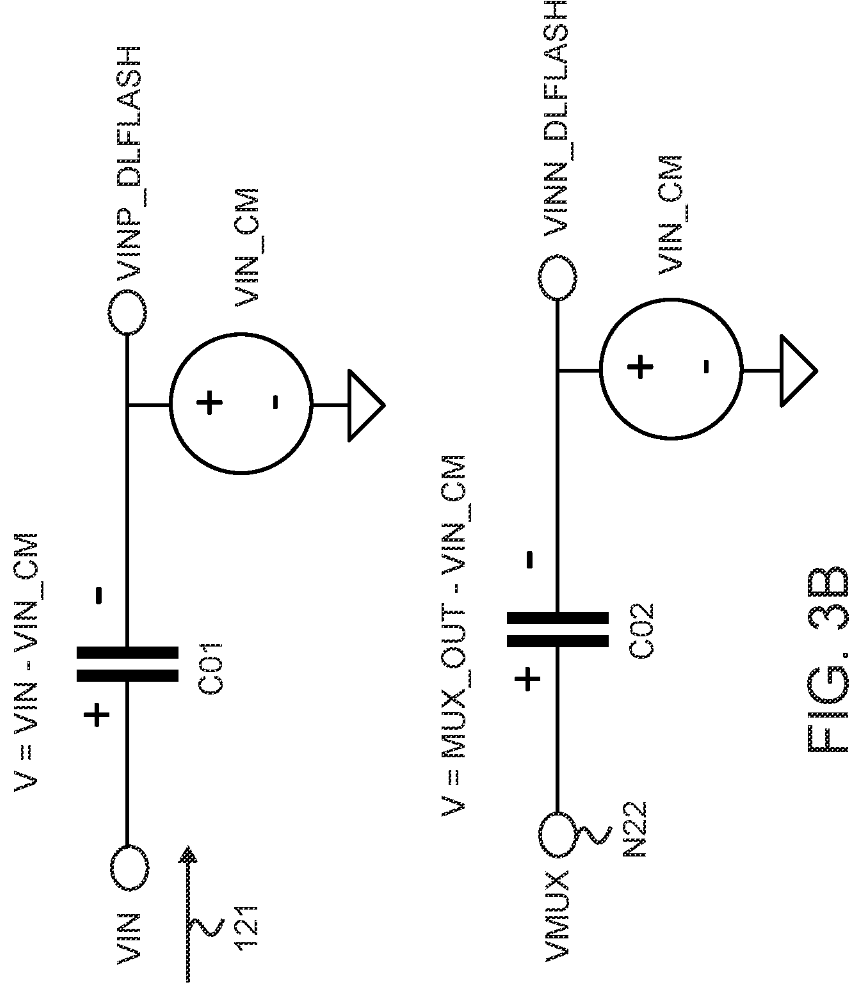
Figure 3C:
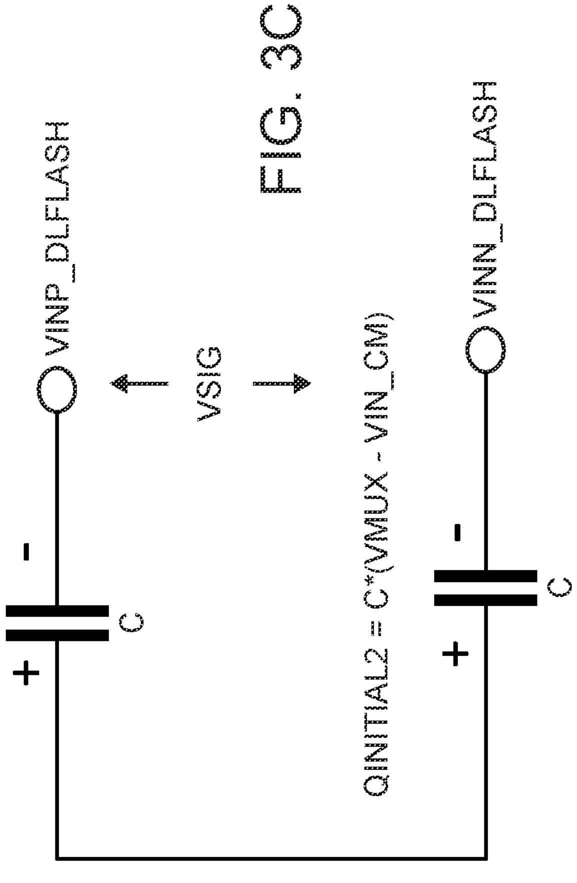

FIGS. 3A, 3B, and 3C, are example diagrams illustrating implementation of a switched capacitor circuit as discussed herein.

As shown in FIG. 3A, and as previously discussed, the channel 0 of the switched capacitor circuit 199 is controlled to generate a respective sample of the error signal with respect to a common mode voltage.

As shown FIG. 3B, and as previously discussed, the controller 140 control states of the switches associated with storing sample voltages in the capacitors C01 and C02.

As shown in FIG. 3C, and as previously discussed, the controller control states of the switches associated with producing a respective signal vsig supplied to the selector circuit 410 on channel 0. Channel 0 signal conversion is intermixed amongst implementation of offset and gain calibration in a manner as previously discussed and as further discussed below.

Figure 4A:
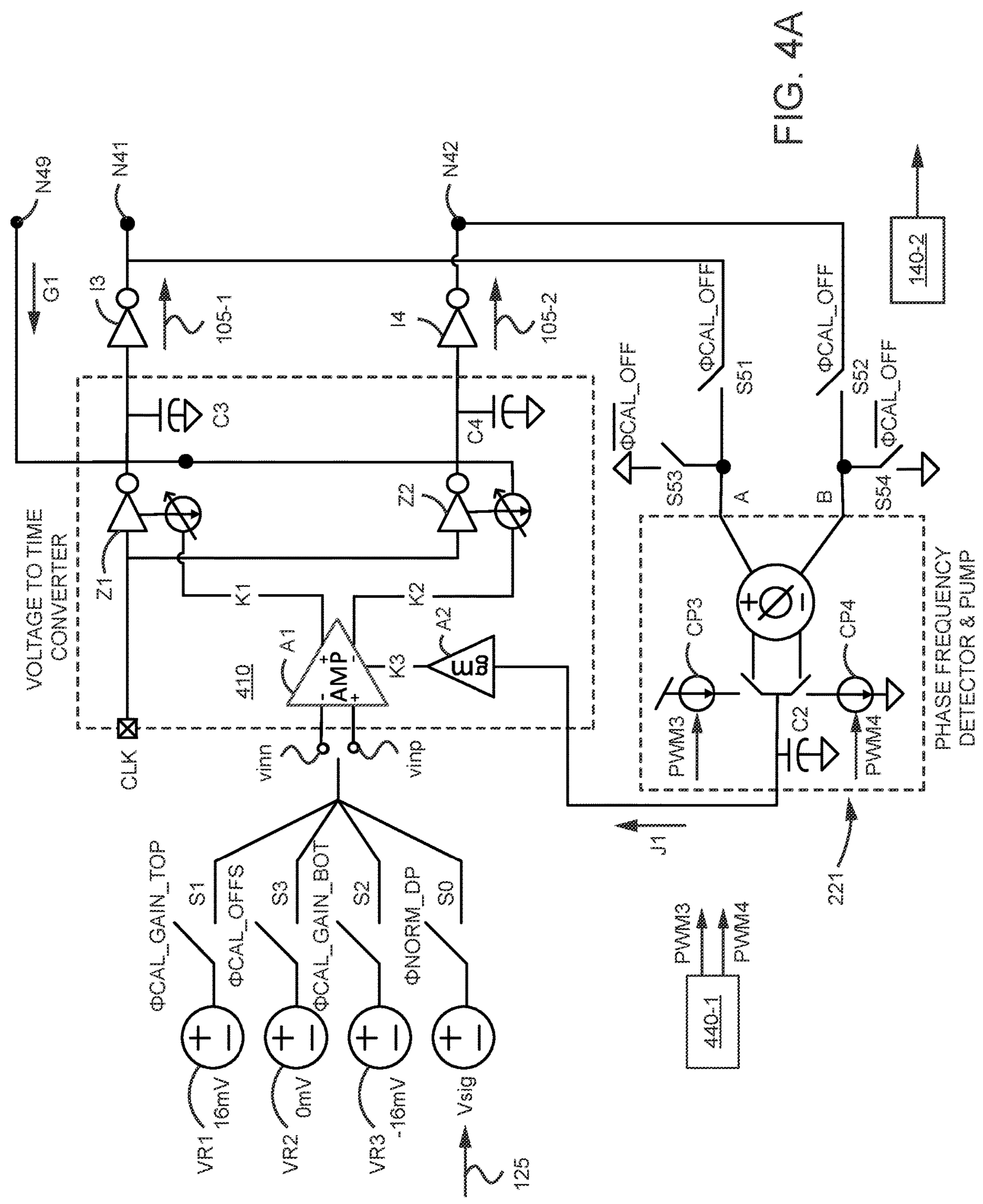
FIGS. 4A and 4B are example diagrams illustrating a voltage to time converter (signal generator), delay line ADC circuitry, and corresponding calibration circuitry as discussed herein.
Figure 4B:
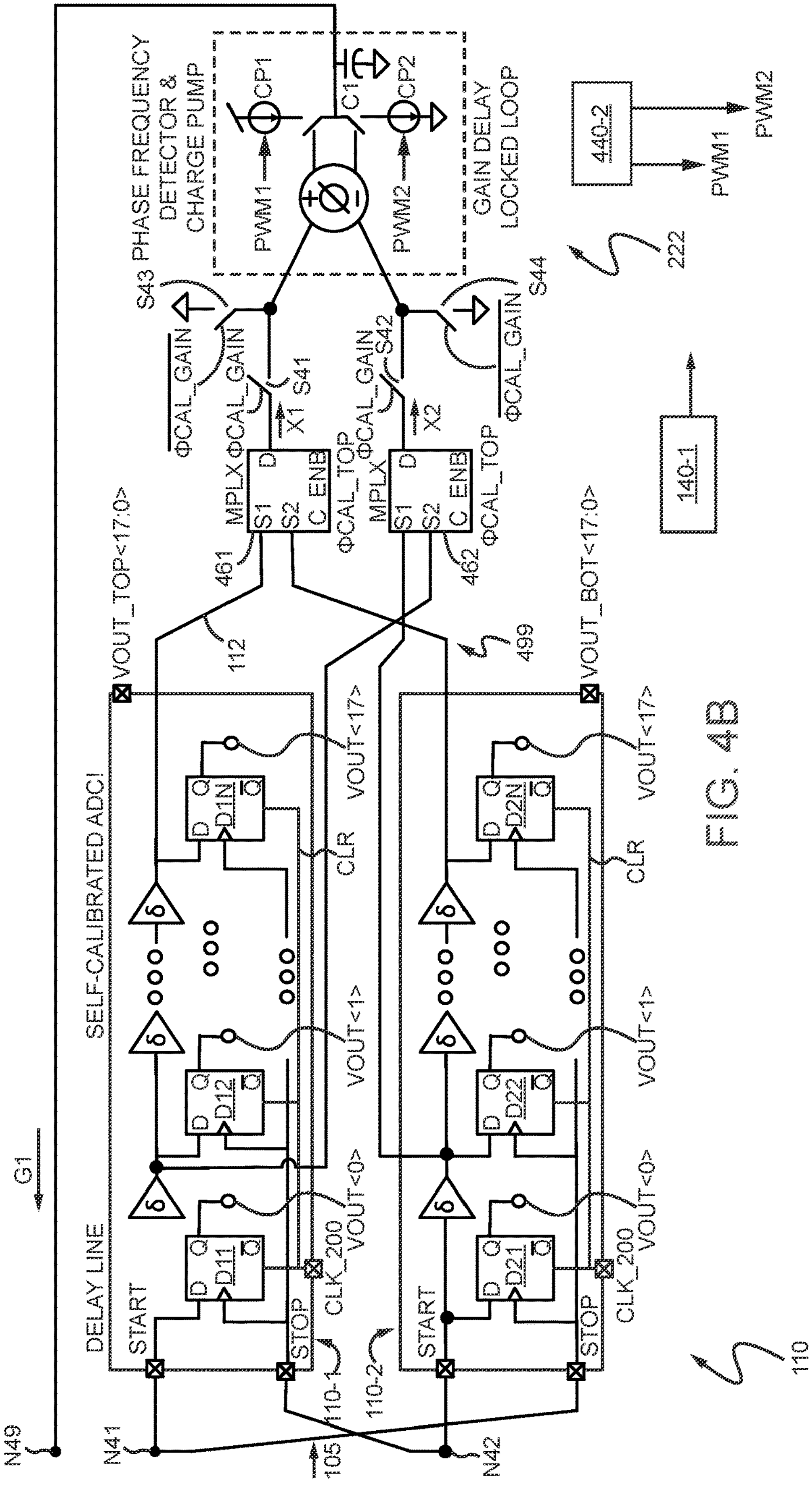

FIGS. 4A and 4B are example general diagrams illustrating a block diagram associated with the delay line ADC and corresponding calibration functionality as discussed herein.

In this example, with reference to FIGS. 4A and 4B and other drawings, the tracking ADC includes a selector function 410, the delay line analog-to-digital converter 110 (such as including delay line analog-to-digital converter 110-1 and delay line analog-to-digital converter 110-2), a voltage to time converter 210 (controller of the delay line ADC 110), calibration circuitry 221, and calibration circuitry 222.

The controller 140-2 or other suitable entity generates one or more control signals such as including signal dl_sig_sel (see also FIG. 9) to control switches S0, S1, S2, and S3.

Figure 9:
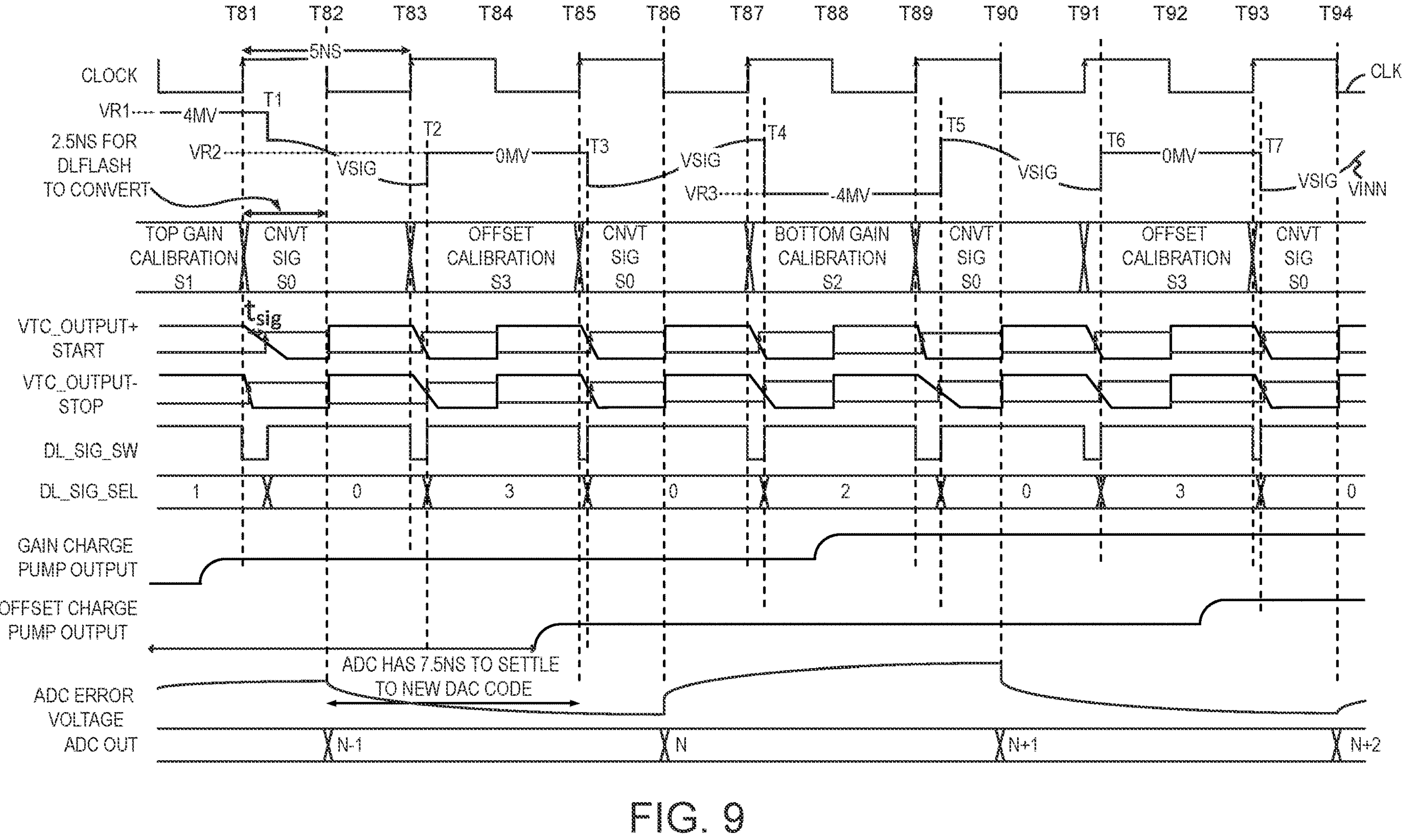
FIG. 9 is a timing diagram illustrating calibration of delay locked loops and analog-to-digital signal conversion as discussed herein.

As its name suggests, and as previously discussed, the selector function 410 controls which of multiple different voltages are inputted to the voltage to time converter 210. For example, in accordance with switching selection as shown in FIG. 9 and signal dl_sig_sel controlling the selection function 410, the selector function 410 switches between inputting the reference voltage the VR1 (such as 16 millivolts DC or other suitable value), the reference voltage VR2 (such as 0 millivolts or ground reference voltage during the suitable value), reference voltage VR3 (such as −16 millivolts DC or other suitable value), and the analog error voltage 125 (any signal of interest). In other words, the selector function 410 is controlled to vary which of the different reference voltages VR1 (Channel 1 associated with switch S1), VR2 (Channel 3 associated with switch S3), VR3 (Channel 2 associated with switch S2), or analog error voltage 125 (Channel 0 such as associated with switch S0) is inputted to the voltage to time converter 210 for conversion into a respective outputted digital error signal 127 (such as the multi-bit value generated by Q outputs of the first set of D flip-flops D11, D12, . . . , DIN or the second set of D flip-flops D21, D22, . . . , D2N).

As further shown, the voltage to time converter 210 includes amplifier A1. The amplifier A1 includes an inverting input to receive the differential voltages associated with the channels selected by the channel selector 410 at the input Vinn and a noninverting input to receive the input Vinp.

As previously discussed, the selector 410 controls which of the different reference voltages VR1, VR2, VR3, or analog error voltage 125 is inputted to the voltage to time converter 210.

Yet further, the positive output of the amplifier A1 produces signal K1 to drive the current starved inverter Z1. The negative output of the amplifier A1 produces signal K2 to drive the current starved inverter Z2. The current starved inverter Z1 receives the clock signal clk_200_*n* as input.

Additionally, the output K3 of the transconductance amplifier A2 provides offset calibration of the amplifier A1. As further shown, the voltage to time converter 210 further receives the clock signal CLK, which is inputted to each of the current starved inverter Z1 and the current starved inverter Z2. The current starved inverter Z2 receives the clock signal clk_200_*n* as input.

The current starved inverter Z1 produces the output signal voutp (voltage), which is stored in capacitor C3 and supplied to the inverter I3.

The current starved inverter Z2 produces the output signal voutn, which is stored in capacitor C4 and supplied to the inverter I4.

As further shown, the inverter I3 receives the signal voutp and inverts it to produce a corresponding control signal 105-1 applied to the node N41. The signal 105-1 at node N41 is a start signal for the delay line ADC 110-1. The signal 105-1 at node N41 is a stop signal for the delay line ADC 110-2.

The inverter I4 receives the signal voutn and inverts it to produce the output control signal applied to the node N42. The signal 105-2 at node N42 is a start signal for the delay line ADC 110-2. The signal 105-2 at node N42 is a stop signal for the delay line ADC 110-1.

With reference to FIG. 4B, each of the delay line ADCs 110-1 and 110-2 includes a sequence of multiple D flip-flops connected in series to produce the respective digital error signal 127-0. The digital output of each of the delay line circuitry 110 represents a corresponding magnitude of the differential voltage selected by the selector 410.

For example, the delay line ADC 110-1 (top delay line ADC) includes flip-flop D11, flip-flop D12, . . . , and flip-flop DIN. Each of the D flip-flops in the delay line ADC 110-1 is clocked by the stop signal 105-1 at node N42. The signal (such as clock pulse or signal edge) at node N41 passes through each of the delay elements (labeled delta) in accordance with respect of the ways associated with each delay element, which provides input to the respective D input of a respective D flip-flop. Overall, in one example, the delay line ADC 110-1 produces the top 18 bits (such as positive output values) such as top digital output bits 17:0 such as vout_top<17 . . . 0> for a given input voltage inputted to the voltage to time converter 210. Clock signal clk_200 (inversion of clock signal clk_200_*n*) resets each of the D flip-flops in the analog-to-digital converter circuitry 110-1.

The delay line ADC 110-2 (bottom delay line ADC) includes flip-flop D21, flip-flop D22, . . . , and flip-flop D2N. Each of the D flip-flops in the delay line ADC 110-2 is clocked by the stop signal at node N41. The signal at node N42 passes through each of the delay elements (labeled delta), which provides input to the respective D input of the respective flip-flop. Overall, the delay line ADC 110-2 produces the bottom 18 bits (for negative output values) such as bottom digital output bits 17:0 such as vout_bot<17 . . . 0> for a given input voltage inputted to the voltage to time converter 210. Clock signal clk_200 (inversion of clock signal clk_200_*n*) resets each of the D flip-flops in the analog-to-digital converter circuitry 110-2.

Thus, the input voltages (vinn and vinp) supplied to the voltage to time converter 210 in FIG. 4A is converted by the voltage to time converter 210 into a difference in time represented by the delay between start and stop rising edges at respective nodes N41 and N42. This delay is quantized by the delay line analog-to-digital converter circuitry to produce a respective digital output representative of the magnitude of the differential input voltage inputted to the amplifier A1 at nodes vinn and vinp. Thus, the delay line analog-to-digital converter circuitry 110 converts the differential voltage vinn and vinp into a respective sample digital output signal 139 produced by the respective delay line analog-to-digital circuitry 110.

In one example, note that the top and bottom delay lines are folded around the 0 mV error (reference voltage VR2). Start and stop signals (at node N41 and node N42) inputted to each of the delay line ADC 110-1 and the delay line 110-2 are swapped as previously discussed. Additionally, the bottom delay line ADC 110-2 digitizes the negative range associated with the delay line ADC 110 while the top delay line ADC 110-1 digitizes the positive range associated with the delay line ADC 110. Thus the delay line analog-to-digital converter circuitry 110-1 produces positive digital output values (127) when a magnitude of the differential voltage received by the amplifier A1 is positive; the delay line analog-to-digital converter circuitry 110-2 produces negative digital output values (127) when a magnitude of the differential voltage received by the amplifier A1 is negative.

As further shown, and as previously discussed, the circuitry shown in FIG. 4 can be configured to include multiple delay locked loops (such as calibration circuitry 221, and calibration circuitry 222) that control the resolution of the delay line ADC 110 over process, voltage temperature, and aging.

As further discussed herein, a delay lock loop (DLL) controls error from both the voltage to time converter 210 and each of the delay line ADCs associated with the delay line ADC 110.

Yet further, the additional FIGS. as discussed herein describe how the delay line ADC 110 and corresponding circuitry alternate conversion of the real input signal (such as the analog error voltage signal 125 or other signal) with calibrating the gain associated with the current starved inverters and the offset associated with the amplifier A1 such as while the rest of the tracking loop is settling.

In one example, the delay line analog-to-digital converter circuitry includes a first delay line analog-to-digital converter circuit 110-1 and a second delay line analog-to-digital converter 110-2 disposed in parallel to convert the received analog voltage (differential voltage as indicated by vinn and vinp) into corresponding samples of digital output signals.

As further discussed herein, the received analog voltage (vinn and vinp) can be supplied by a selector circuit 410 (such as a multiplexer circuit) where different types of analog voltage signals are inputted to the signal generator circuit (voltage to time converter 210) for conversion into respective samples of the digital signal 127-0.

In yet another example, as previously discussed, a first delay line analog-to-digital converter circuit 110-1 of the delay line analog-to-digital converter circuitry 110 is operative to generate a first portion of the corresponding samples for a first operational condition in which the analog voltage is greater than a threshold level such as for positive values; and a second delay line analog-to-digital converter circuit 110-2 of the delay line analog-to-digital converter circuitry 110 is operative to generate a second portion of the corresponding samples during a second operational condition in which the received analog voltage at the input of the amplifier A1 is less than the threshold level for negative values.

Note further that the control signals as discussed herein can be configured to include a first control signal such as voltage at node N41 and a second control signal such as voltage at node N42. The first control signal can be configured to control a start operation of the first delay line analog-to-digital converter circuit 110-1; the second control signal can be configured to control a stop operation of the first delay line analog-to-digital converter circuit 110-1. The second control signal can be configured to control a start operation of the second delay line analog-to-digital converter circuit 110-2; the first control signal can be configured to control a stop operation of the second delay line analog-to-digital converter circuit 110-2.

In accordance with still further examples as discussed herein, the apparatus can be configured to include selector circuitry 410 operative to select between a first output signal X1 generated by the first delay line analog-to-digital converter circuit 110-1 and a second output signal X2 generated by the second delay line analog-to-digital converter circuit 110-2. The calibration circuitry 222 can be configured to use the first signal X1 and the second signal X2 as a basis in which to calibrate the signal generator circuitry and/or the delay line analog-to-digital converter circuitry.

In accordance with still further examples, the calibration circuitry 222 can be configured to include a gain calibration loop where a gain associated with the delay line analog-to-digital converter circuitry 110 is configured to match a gain setting of a tracking loop associated with the tracking analog-to-digital converter circuit.

Still further, note that the signal generator circuit (voltage to time converter 210) can be configured to include an amplifier A1 operative to receive the analog voltage (differential voltage vinn and vinp). The calibration circuitry as discussed herein can be configured to include an offset calibration circuit 221 operative to monitor the control signals at node N41 and node N42 inputted to the delay line analog-to-digital converter circuitry 110. The offset calibration circuitry 221 further can be configured to generate an offset adjustment control signal J1 based on the monitored control signals at node N41 and node N42 inputted to the delay line analog-to-digital converter circuitry. The offset adjustment control signal J1 adjusts an offset associated with the amplifier A1. For example, the transconductance amplifier A2 receives the calibration signal J1 and converts it into an output signal supplied by the transconductance amplifier A2 to correct the offset associated with the amplifier A1.

In one example, the offset calibration circuitry 221 is an offset delay locked loop circuit operative to produce the offset adjustment control signal J1 and corresponding output signal of the transconductance amplifier A2 supplied to the amplifier A1.

In yet further examples, as previously discussed, the signal generator circuit (voltage to time converter 210) may include an amplifier A1 operative to receive the analog voltage (such as difference between vinn and vinp). The calibration circuitry as shown in FIG. 4B can be configured to include a gain calibration circuit 222 operative to monitor digital samples as outputted from the delay line analog-to-digital converter circuitry 110. The gain calibration circuitry 221 can be configured to generate a gain adjustment control signal G1 (at node N49) based on the outputted digital samples of the delay line analog-to-digital converter circuitry, where the generated gain adjustment control signal G1 (such as voltage stored in the capacitor C1) adjusts a gain associated with the amplifier subsequently converting further samples of the received analog voltage into the control signals. Note again that the gain calibration circuitry 221 can be configured as a gain delay locked loop circuit as shown in FIG. 4B.

In accordance with another example as discussed herein, the delay line analog-to-digital converter circuitry 110 can be configured to include: a first delay line analog-to-digital converter 110-1 operative to generate positive polarity error values associated with conversion of the received analog voltage (vinn and vinp) into the digital signal; and a second delay line analog-to-digital converter 110-2 operative to generate negative polarity error values associated with conversion of the received analog voltage into the digital signal.

In a further example, the signal generator circuit is a voltage-to-time converter 210 operative to produce a start signal (voltage at node N41) and a stop signal (voltage at node N42) supplied to the delay line analog-to-digital converter circuitry 110-1 where a magnitude of a time duration between the start signal and the stop signal depends on a magnitude of the received analog voltage at the input of amplifier A1. The calibration circuitry 221 can be configured to calibrate the voltage-to-time converter for a 10 based on the calibration feedback (such as voltage is monitor at the nodes N41 and N42) in a manner as previously discussed.

Yet further, the apparatus as discussed herein can be configured to include a selector circuit 410 operative to select amongst multiple analog inputs as the analog voltage inputted to the signal generator. For example, the selector circuit can be configured to select amongst: i) a first analog gain reference voltage VR1, ii) a second analog gain reference voltage VR3, iii) an offset reference voltage VR2, and iv) and the analog error voltage 125.

The analog voltage 121 received and converted into the digital signal 127 produced by the delay line analog-to-digital converter circuitry 110 as discussed herein can be: i) a first analog gain reference voltage, ii) a second analog gain reference voltage, iii) an offset reference voltage, or iv) the analog error voltage. In one example, the calibration circuitry (221 and/or 222) is operative to produce calibration feedback (such as gain adjustment control signal G1, offset adjustment signal J1, etc.) based on analog-to-digital conversions of the first analog gain reference voltage, the second analog gain reference voltage, and the offset reference voltage at different times during an analog-to-digital converter cycle.

Note that the calibration circuitry can be configured to include gain calibration circuitry 222 and offset calibration circuitry 221. As shown in FIGS. 4A and 4B, the gain calibration circuitry 222 may include a first set of charge pumps CP1 and CP2 to produce a gain calibration signal G1 supplied to the signal generator circuit 410. The gain calibration signal G1 calibrates a gain associated with the signal generator circuit 410. The offset calibration circuitry 221 may include a second set of charge pumps CP3 and CP4 to produce an offset calibration signal J1 supplied to the signal generator circuit 410. The offset calibration signal J1 calibrates the offset associated with the generator circuit 410. The apparatus as discussed herein may further include: i) first pulse width calibration circuitry 440-1 operative to adjust pulse widths of first pulse width modulation signals PWM1 and PWM2 applied to the respective first set of charge pumps CP1 and CP2 to calibrate the first set of charge pumps and corresponding first phase frequency detector (a.k.a., 221) based on an output of the delay line analog-to-digital converter circuitry in a calibration mode, and ii) second pulse width calibration circuitry 440-2 operative to adjust pulse widths of second pulse width modulation signals PWM3 and PWM4 applied to the second set of charge pumps CP3 and CP4 to calibrate the second set of charge pumps and a second phase frequency detector (a.k.a., 222) based on the output of the delay line analog-to-digital converter circuitry 110 in the calibration mode.

Figure 5A:
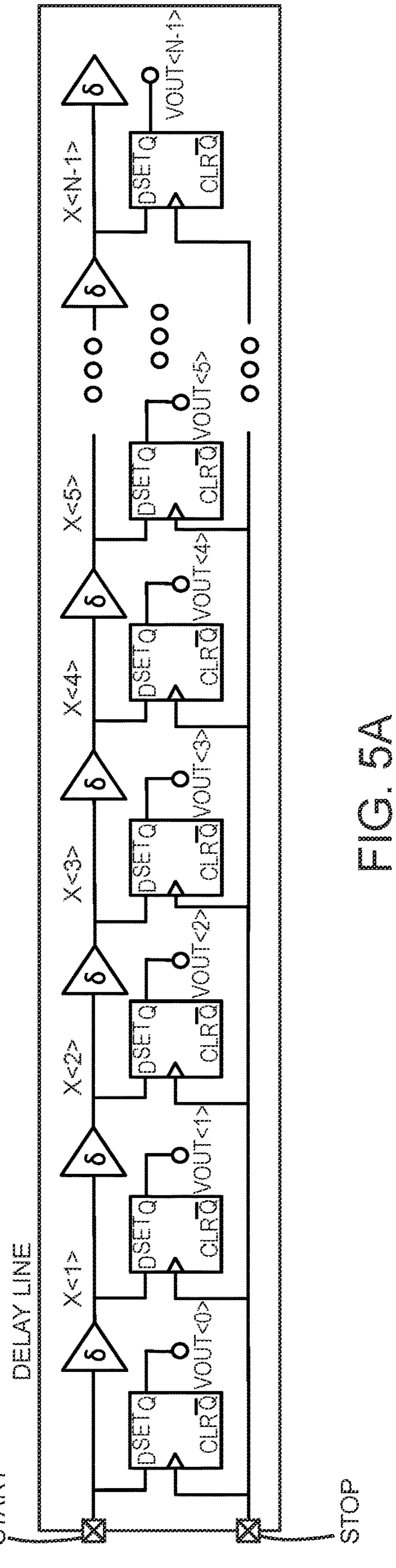
FIG. 5A is an example top level diagram illustrating a delay line ADC as discussed herein.

FIG. 5A is an example diagram of the delay line ADC as discussed herein.

Delay Line Operation

- The schematic of the respective delay line analog-to-digital converter 110-1 and analog-to-digital converter 110-2 is shown in FIG. 5A. As previously discussed, the respective delay line analog-to-digital converter converts the time domain signals received from node N41 and node N42 into a corresponding digital code such as error signal 127.
- Each delay line analog-to-digital converter includes a chain of delay cells which are represented by a buffer with a delay value of 8 seconds. The delay value delays propagation of a respective one or 0 inputted to the delay line analog-to-digital converter from the node N41 or node N42.
- Each output of the buffers are connected to a flip-flop which is clocked by the stop signal.
- The delay line operates by digitizing the difference between start and stop rising edge delay to convert the respective input voltage received at vinn and vinp into a respective digitized error signal 127 is stored in the D flip-flops of the delay line analog-to-digital converter circuitry 110.
- Each flip flop in the chain of D flip-flops in each of the different delay line analog-to-digital converters hundred 10 acts as a comparator, which outputs a 1 if the delayed version of start is faster than the stop signal
- The delay line outputs the thermometer encoded signal of tsig/δ

Figure 5B:
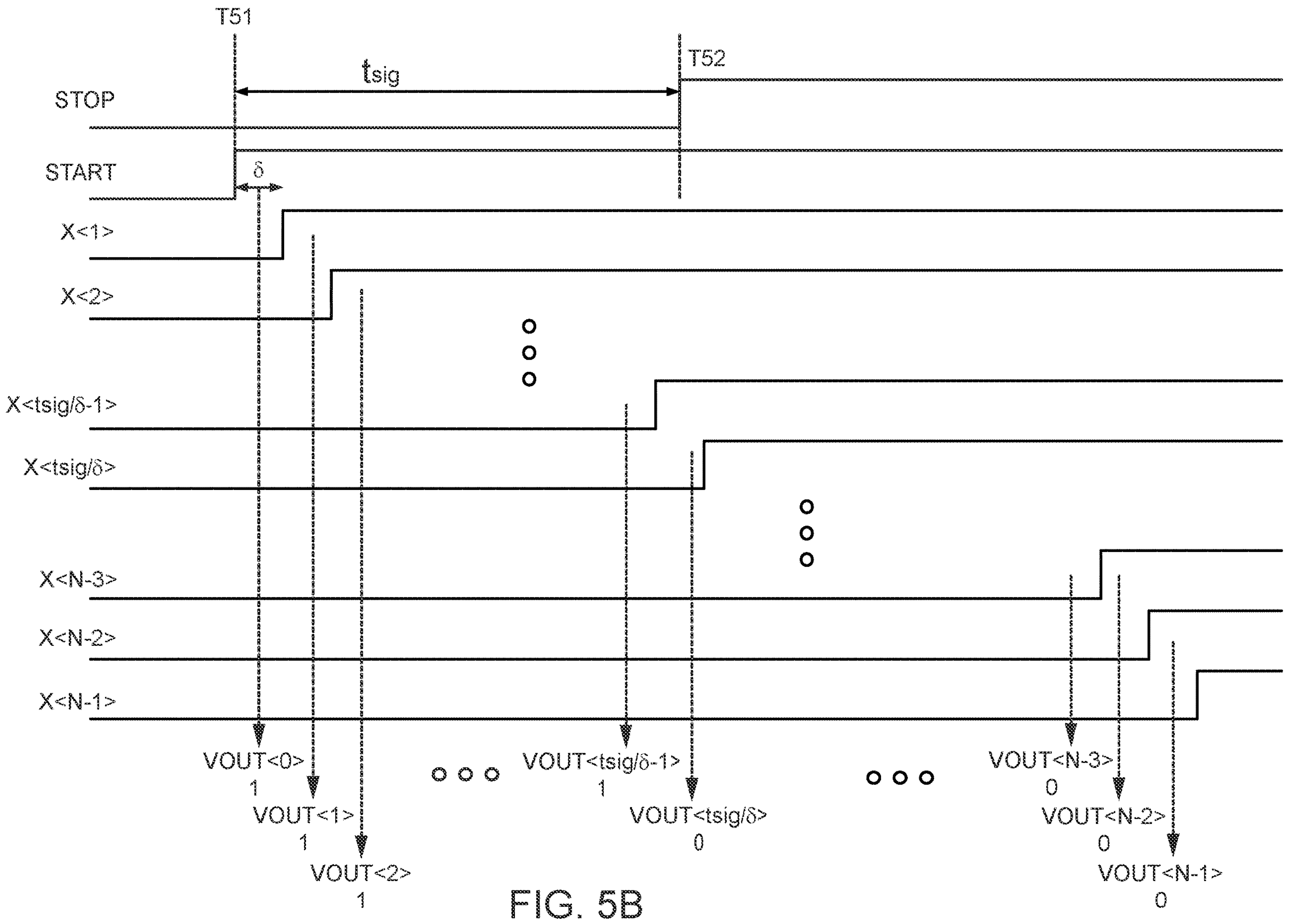
FIG. 5B is an example timing diagram illustrating signals associated with the delay line ADC as discussed.

FIG. 5B is a timing diagram associated with generating the respective control signals outputted from the voltage to time converter to control operation of the delay line ADC as discussed herein.

As shown in this example, the voltage to time converter 210 produces the rising edge of the START control signal from node N41 to occur at time T51. The voltage to time converter 210 produces the rising edge of the stop signal from node N42 to occur at time T52. The time difference between time T51 and T52 is tsig.

The logic 1 associated with the start signal from node N41 is conveyed through the series of delay elements as shown in FIG. 5A. The delay time associated with each of the delay elements is the value δ. At time T51, the delay line analog-to-digital converter 110 produces a respective error signal 127 based upon the settings of bits vout<0>=1, vout<1>=1, vout<2>=1, . . . , vout<tsig/δ−1>=0, vout<tsig/δ>=0, . . . , vout<n−3>=1, vout<n−2>=0, vout<n−1>=0 from the D flip-flops (such as Q outputs of the D flip-flops D11, D12, . . . , DIN or Q outputs of the D flip-flops D21, D22, . . . , D2N) of the delay line analog-to-digital converter circuitry 110-1 or 110-2 depending upon signal polarity of the received error signal 125.

Accordingly, the delay line analog-to-digital converter is shown in FIG. 5A and corresponding voltage to time converter 210 converts the received analog input voltage into a respective digital error signal 127 (digital output signal) based on the settings of the above bits (such as Q outputs of the D flip-flops D11, D12, . . . , DIN or Q outputs of the D flip-flops D21, D22, . . . , D2N) for a respective analog voltage conversion into a digital value.

Of course, as the magnitude of tsig varies depending upon a magnitude of the input voltage supplied at node vinn and vinp such as one of reference voltages VR1, VR2, VR3, or analog error voltage 125 as selected by the selective 410, the delay line analog-to-digital converter 110 produces corresponding digital error signals 127 proportional to the input voltage vinn and vinp.

Figure 6:
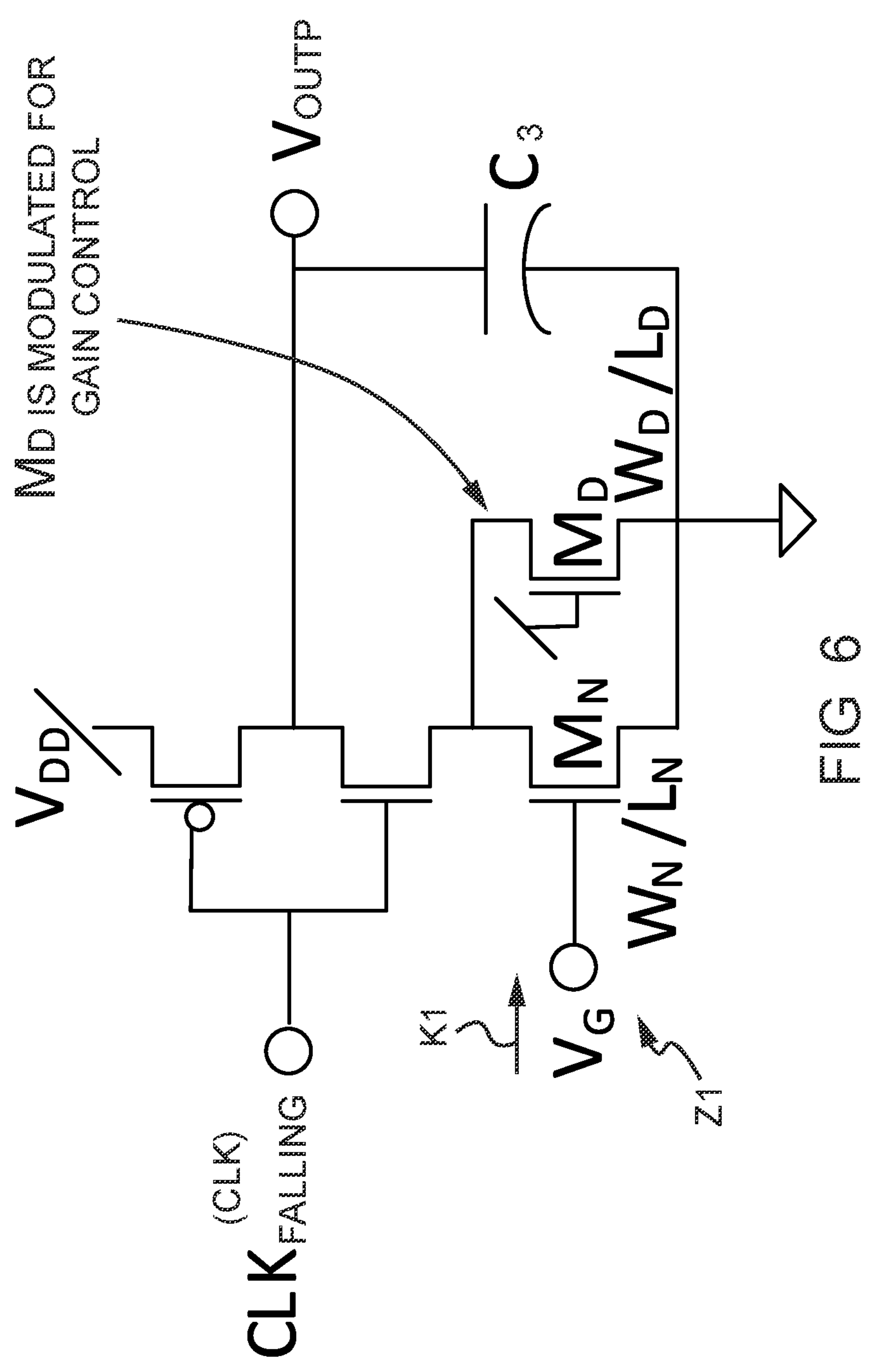
FIG. 6 is an example diagram illustrating a current starved inverter as discussed herein.

FIG. 6 is an example diagram illustrating a so-called current starved inverter as discussed herein.

As previously discussed, the voltage to time converter 210 can be configured to include one or more current starved inverters Z1 and Z2. FIG. 6 is an example of the current starved inverter Z1 that receives the clock CLK as an input signal to produce the respective output signal voutp. The current starved inverter Z2 is the same as current starved inverter Z1 that receives the clock CLK (clk_200_*n*) as an input signal to produce the respective output signal voutn.

The control voltage VG (such as signal K1) associated with the current starved inverter Z1 modulates the current through the inverter and so modulates the propagation delay (tpn) between the input falling clock edge of signal CLK (clk_200_*n*) and the output falling clock edge of signal CLK (note that the rising edge is unaffected).

Transistor MD provides a minimum amount of current to the inverter which leads to better linearity but less range.

The Delay Locked Loop (such as gain or offset) associated with the calibration circuitry 221/222 as discussed herein uses transistor MD to modulate the gain over process corners/temperature/life.

Differential CSI stages take the difference of two CSI (Current Starved Converter) stages such as Z1 and Z2 with differential voltage inputs around an input common mode voltage.

CSI input common mode has to be operated at the optimal point of the ∂tp/∂Vg to maximize the range.

Signal tsig becomes the difference of two falling edges (voutp and voutn) from duplicate CSI stages which leads to better linearity due to the same shape of the edge Differential CSI stages have twice the range for the same linearity performance and same operation region of the control voltage Formula for slew rate of current starved inverter output:

$$-(dV\_\text{out})/dt=(i\_(d\_N)+i\_(d\_D))/C\_L$$

As previously discussed, the gain calibration circuitry 222 generates the corresponding adjustment signal G1 to control slew rates associated with the current starved inverters Z1 and Z2. The adjustments to the slew rates ensure that the conversion of the input voltages at the amplifier A1 are properly converted into a respective digital output voltage from the delay line analog-to-digital converter circuitry 110. For example, the slew rate adjustments is supported by the gain adjustment signal G1 ensure that the delay line analog-to-digital converter circuitry 110 produces the appropriate digital output value for each of the calibration voltages VR1, VR2, and VR3. Calibration of the circuitry with respect to these reference voltages ensures that the conversion of the analog signal 125 (VSIG) is as accurate as possible.

Figure 7:
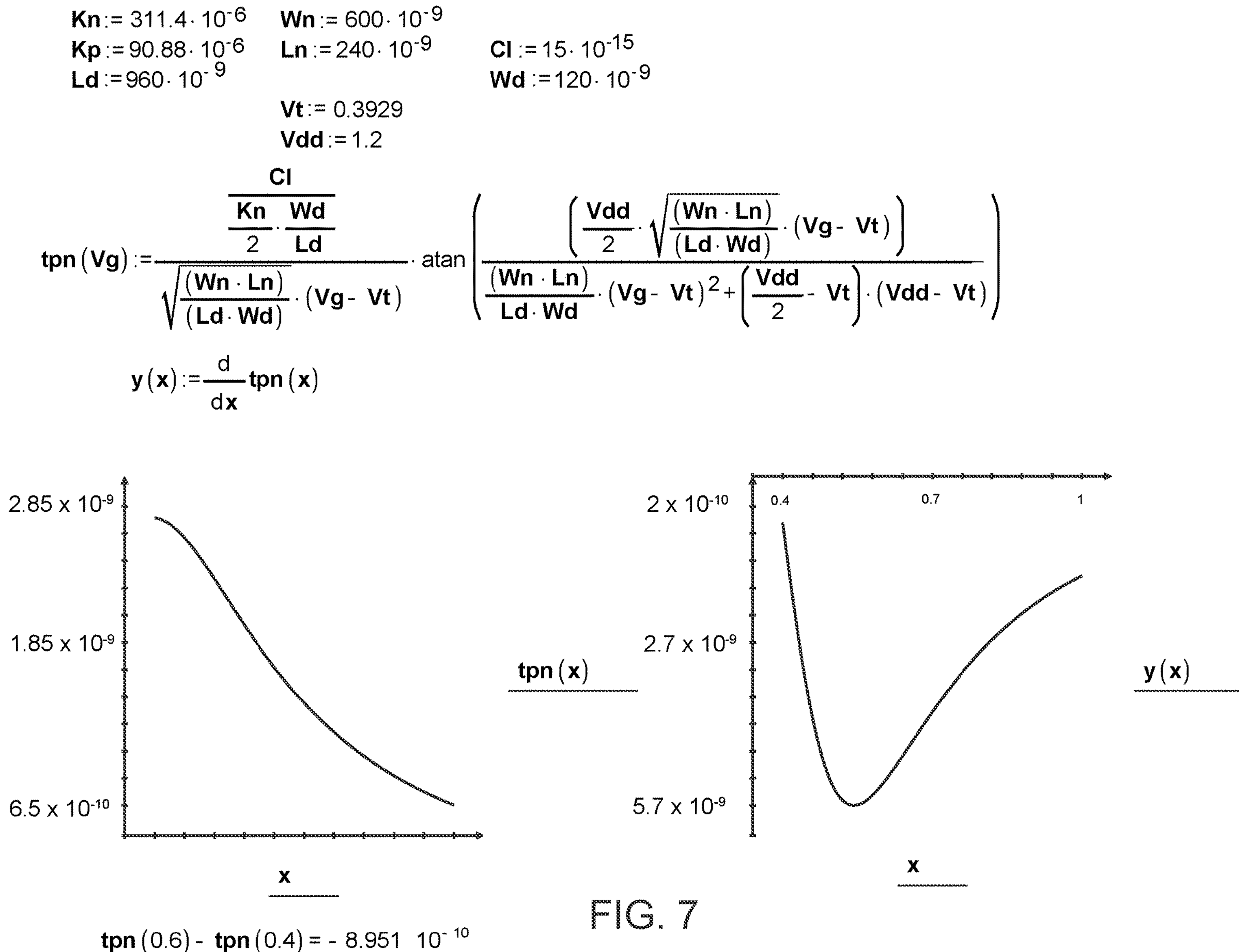
FIG. 7 is an example diagram illustrating equations associated with the current starved inverters implemented in an analog-to-digital converter as discussed herein.

FIG. 7 is an example diagram illustrating equations associated with the current starved inverters as discussed herein.

Figure 8:
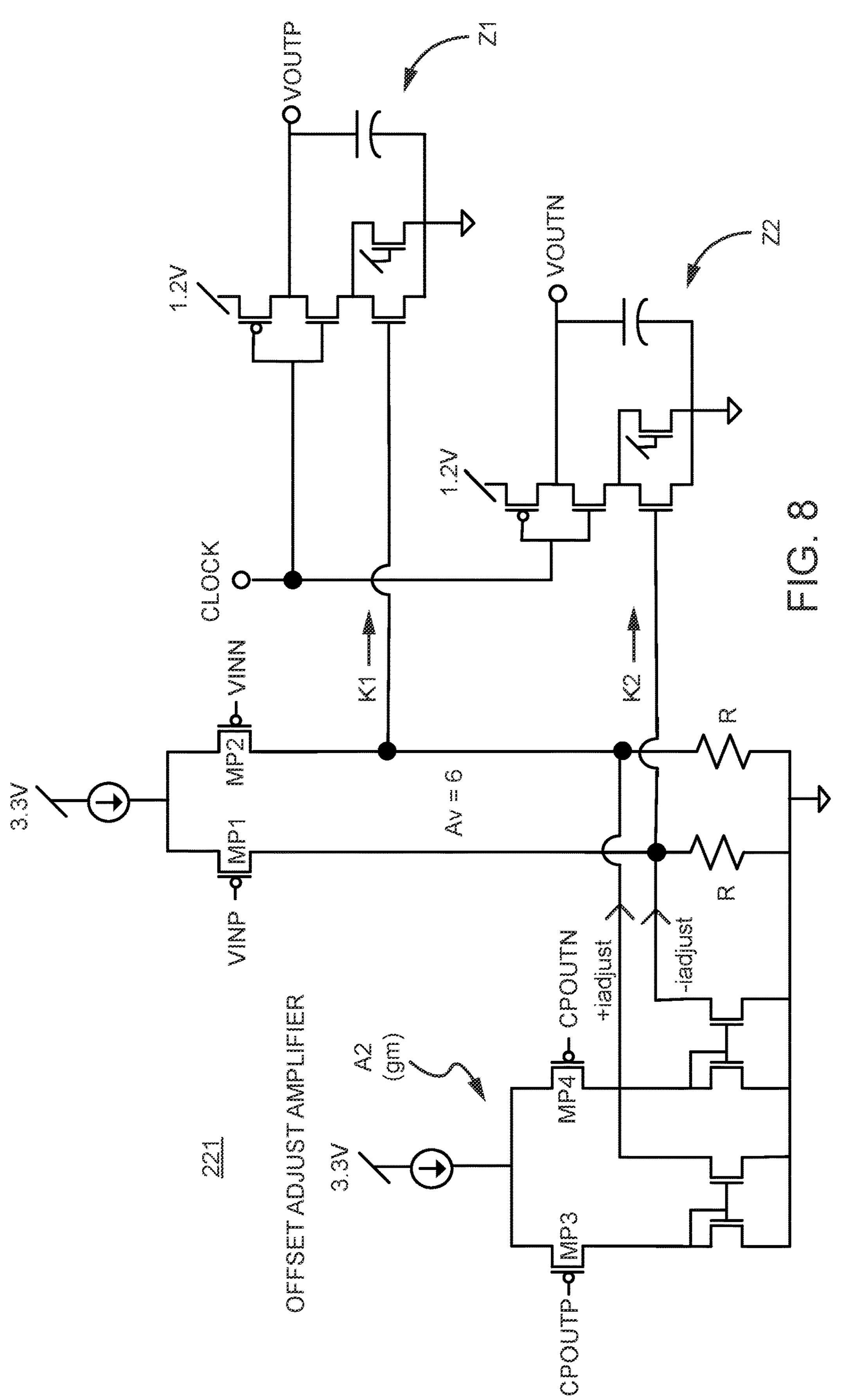
FIG. 8 is an example diagram illustrating a voltage to time converter as discussed herein.

FIG. 8 is an example diagram illustrating implementation of a voltage time converter as discussed herein.

The Voltage to time converter 210 can be configured to have a low input impedance front-end open loop amplifier to maximize the bandwidth of the tracking loop with a nominal gain of around 6 or other suitable value. The impedance can be minimized by selecting minimum sized devices for Mp1 and Mp2 since the offset their mismatch generates will be cancelled by the adjustment signal generated by the transconductance amplifier A2 associated with the offset Delay Locked Loop (calibration circuitry 221).

The current to the inverters Z1 and Z2 can be modulated with the differential output of the front-end.

Yet further, the VTC 210 also converts the voltage from the 3.3V domain to the 1.2V domain.

If desired, the Range/Resolution of the Flash delay line analog-to-digital converter can be increased by decreasing the gain of the open-loop front-end amplifier. Bandwidth requirement for front-end of CSI stage: must meet requirement from switching between signal & calibration maximum due to the DLL (Delay Lock Loop).

$$5\tau < 5\text{ ns (for 100 Mhz } VSADC) \rightarrow f_{3dB} > 1/(2*\pi*(1\text{ ns})) > 159\text{ Mhz}$$

- MP3 and MP4 diff pair adjust the overall offset of the delay line flash by adjusting the offset to the input of the CSI.
- Iadjust is used to correct the offset of the entire VTC+ delay line chain.
- Largest contributors to the offset are the input pmos diff pair.

The overall offset is 250 ps which is the range that needs to be accommodated by the offset loop.

Dynamic Flip-Flop

Note further that so-called dynamic flip-flop can be implemented for the flip-flops in the delay line analog-to-digital converter circuitry 110.

The dynamic flip-flop can provide negative setup time where the clock can arrive slightly before data.

This is a desirable feature in order to capture the 0 mV error voltage crossing and avoid a dead band for the ADC.

Flip-flop is placed at the zero cross point to have more resolution around the 0 error voltage. When start and stop our perfectly aligned with each other, both the first flip-flops of top and bottom delay lines will output 1. All other flip-flops will output 0 In total, four flip-flops can provide information about error voltages close to 0 in steady-state and determine how to step the tracking ADC Encoding of DLADC (Delay Line Analog-to-Digital Converter 110)

The encoding of the delay line analog-to-digital converter 110 is shown in Table 1.

The top delay line (delay line analog-to-digital converter 110-1) and the bottom delay line (delay line analog-to-digital converter 110-2) have separate output busses. Flip-flops were added to the 0 input signal so there is no dead-band region near zero. There will be redundancy in the vout_top<0> and vout_bot<0> outputs since they both capture the middle crossing.

The flip-flop used has a slightly negative setup time (−2.8 ps) which varies over process and mismatch but is always negative.

- The added bits should give us more flexibility in how the ADC can step.
- The step size of the ISADC can be changed based on the four combinations of vout_top<0> and vout_bot<0>.
- If they are both 1, it means that the signal is between 0 mV+/−setup time of flip-flop (between −150 uV and 150 uV)

TABLE 1

| vsig | vout top<17:0> | vout bot<17:0> | case #1 | case #2 | case #3 |
|---|---|---|---|---|---|
| −16 mv | 000000000000000000 | 001111111111111111 | 16 | 16 | 17 |
| −15 mv | 000000000000000000 | 000111111111111111 | 15 | 15 | 16 |
| −14 mv | 000000000000000000 | 000011111111111111 | 14 | 14 | 15 |
| −13 mv | 000000000000000000 | 000001111111111111 | 13 | 13 | 14 |
| −12 mv | 000000000000000000 | 000000111111111111 | 12 | 12 | 13 |
| −11 mv | 000000000000000000 | 000000011111111111 | 11 | 11 | 12 |
| −10 mv | 000000000000000000 | 000000001111111111 | 10 | 10 | 11 |
| −9 mv | 000000000000000000 | 000000000111111111 | 9 | 9 | 10 |
| −8 mv | 000000000000000000 | 000000000011111111 | 8 | 8 | 9 |
| −7 mv | 000000000000000000 | 000000000001111111 | 7 | 7 | 8 |
| −6 mv | 000000000000000000 | 000000000000111111 | 6 | 6 | 7 |
| −5 mv | 000000000000000000 | 000000000000011111 | 5 | 5 | 6 |
| −4 mv | 000000000000000000 | 000000000000001111 | 4 | 4 | 5 |
| −3 mv | 000000000000000000 | 000000000000000111 | 3 | 3 | 4 |
| −2 mv | 000000000000000000 | 000000000000000011 | 2 | 2 | 3 |
| −1 mv | 000000000000000000 | 000000000000000001 | 1 | 1 | 2 |
| −0.15 mv | 000000000000000000 | 000000000000000001 | 1 | 0 | 1 |
| 0 mv | 000000000000000001 | 000000000000000001 | 0 | 0 | 0 |
| 0.15 mv | 000000000000000001 | 000000000000000011 | −1 | 0 | −1 |
| 1 mv | 000000000000000011 | 000000000000000000 | −1 | −1 | −2 |
| 2 mv | 000000000000000111 | 000000000000000000 | −2 | −2 | −3 |
| 3 mv | 000000000000001111 | 000000000000000000 | −3 | −3 | −4 |
| 4 mv | 000000000000011111 | 000000000000000000 | −4 | −4 | −5 |
| 5 mv | 000000000000111111 | 000000000000000000 | −5 | −5 | −6 |
| 6 mv | 000000000001111111 | 000000000000000000 | −6 | −6 | −7 |
| 7 mv | 000000000011111111 | 000000000000000000 | −7 | −7 | −8 |
| 8 mv | 000000000111111111 | 000000000000000000 | −8 | −8 | −9 |
| 9 mv | 000000001111111111 | 000000000000000000 | −9 | −9 | −10 |
| 10 mv | 000000011111111111 | 000000000000000000 | −10 | −10 | −11 |
| 11 mv | 000000111111111111 | 000000000000000000 | −11 | −11 | −12 |
| 12 mv | 000001111111111111 | 000000000000000000 | −12 | −12 | −13 |
| 13 mv | 000011111111111111 | 000000000000000000 | −13 | −13 | −14 |
| 14 mv | 000111111111111111 | 000000000000000000 | −14 | −14 | −15 |
| 15 mv | 001111111111111111 | 000000000000000000 | −15 | −15 | −16 |
| 16 mv | 011111111111111111 | 000000000000000000 | −16 | −16 | −17 |

The delay line analog-to-digital converter circuitry 110 as discussed herein may include first D flip-flops and second D flip-flops as previously discussed. The first D flip-flops in the first delay line analog-to-digital converter circuitry 110-1 and second D flip-flops in the second delay line analog-to-digital converter circuitry 110-2 may be implemented with a negative setup time to provide overlap with respect to producing a digital output signal of the delay line analog-to-digital converter circuitry 110 around the threshold level of 0 volts.

FIG. 9 is an example diagram illustrating interleaving of calibration and converter operation of the delay line ADC as discussed herein.

Calibration Sequence Using the Delay Locked Loops

Ideally, the clock signal and the output of the last buffer in the delay line analog-to-digital converter should be perfectly aligned when the input is at the maximum.

Figure 11:
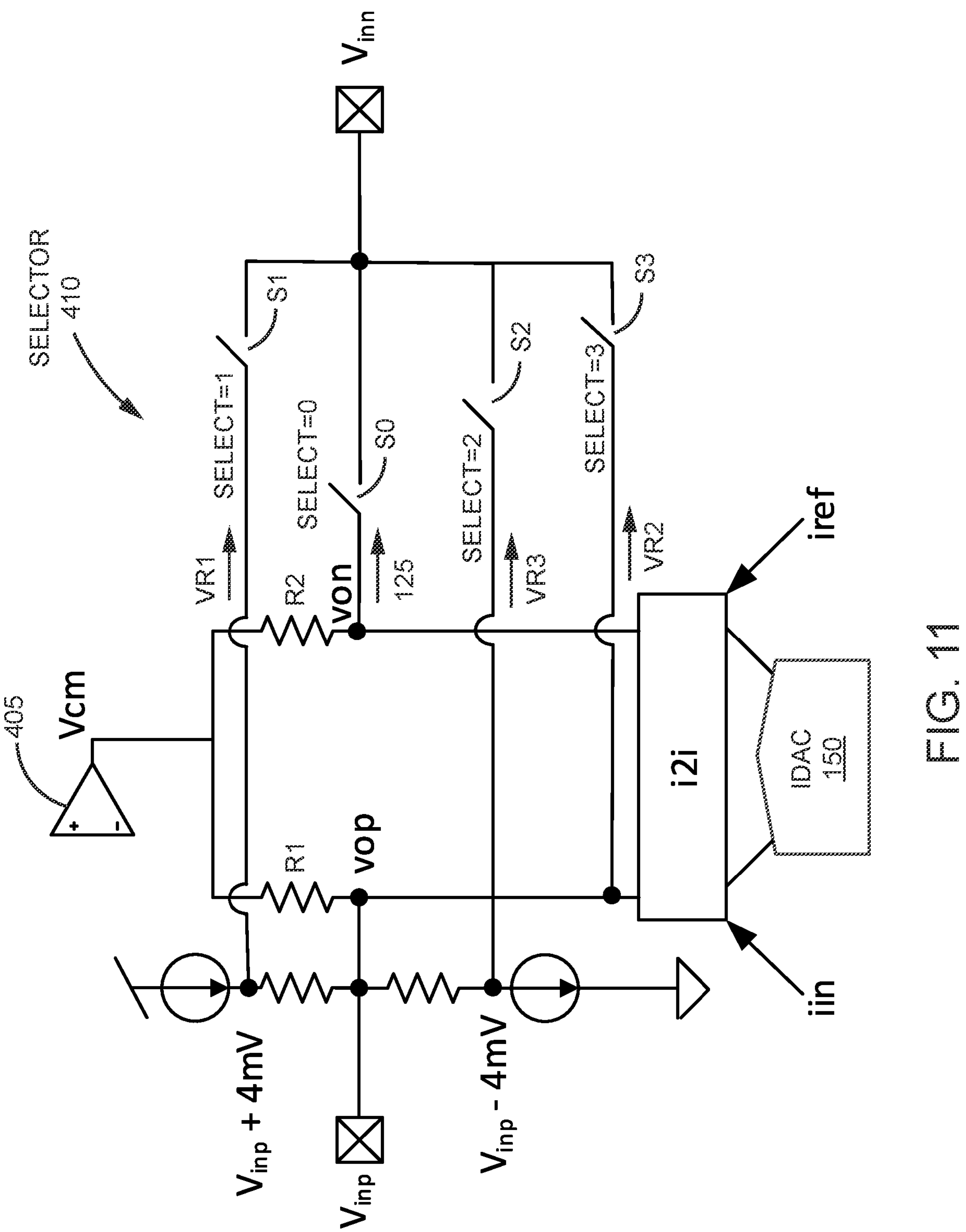
FIG. 11 is an example diagram illustrating implementation of a selector circuit for calibration in signal conversion within a corresponding tracking loop as discussed herein.

The Delay Locked Loop swaps between calibration phase and normal operation where the tracking loop output is digitized. FIG. 9 shows the timing diagram of the dlflash calibration scheme associated with the operation of the delay line analog-to-digital converter circuitry 110. Further details of the selector 410 are shown in FIG. 11. Referring again to FIG. 9 and FIG. 11, the input vinp to the amplifier A1 is the same as signal vop when the analog error voltage signal 125 is selected.

As previously discussed with respect to FIG. 4A in FIG. 4B, the offset calibration circuitry 221 includes switches S51, S52, S53, and S54 controlled by controller 140-1. The calibration circuitry 222 includes switches S41, S42, S43, and S44 controlled by controller 140-2.

Via the selector 410, the input vinn (such as the signal von when the analog error voltage signal 125 as selected) to the amplifier A1 of the voltage to time converter 210 and the corresponding delay line analog-to-digital converter swap or vary over time between:

- top gain calibration (reference voltage VR1) where switch S1 (Channel 1) is activated to an on state and all other switches S0, S2, S3 of the selector 410 are off; for top gain calibration, switches S41, S42, S53, S54, are all set to a closed state (on); for top gain calibration, switches S43, S44, S51, S52, are all set to an open state (off);
- signal conversion (analog error voltage signal 125 or vsig) where switch S0 (Channel 0) is activated to an on state (closed state) and all other switches S1, S2, S3 of the selector 410 are off (open) between time T1 and time T2; between time T1 and time T2, switches S43, S44, S53, S54, are all set to a closed state (on); between time T1 and time T2, switches S41, S42, S51, S52, are all set to an open state (off);
- offset calibration (reference voltage VR2) where switch S3 (Channel 3) is activated to an on state and all other switches S0, S1, and S2 of the selector 410 are off between time T2 and time T3; between time T2 and time T3, switches S43, S44, S51, S52, are all set to a closed state (on); between time T2 and time T3, switches S41, S42, S53, S54, are all set to an open state (off);
- signal conversion (analog error voltage signal 125 or vsig) where switch S0 (Channel 0) is activated to an on state (closed state) and all other switches S1, S2, S3 of the selector 410 are off (open) between time T3 and time T4; between time T3 and time T4, switches S43, S44, S53, S54, are all set to a closed state (on); between time T3 and time T4, switches S41, S42, S51, S52, are all set to an open state (off);

bottom gain calibration (reference voltage VR3) where switch S2 (Channel 2) is activated to an on state and all other switches S0, S1, S3 of the selector 410 are off between time T4 and time T5; between time T4 and time T5, switches S41, S42, S53, S54, are all set to a closed state (on); between time T4 and time T5, switches S43, S44, S51, S52, are all set to an open state (off);

signal conversion (analog error voltage signal 125 or vsig) where switch S0 (Channel 0) is activated to an on state (closed state) and all other switches S1, S2, S3 of the selector 410 are off (open) between time T5 and time T6; between time T5 and time T6, switches S43, S44, S53, S54, are all set to a closed state (on); between time T5 and time T6, switches S41, S42, S51, S52, are all set to an open state (off);

offset calibration (reference voltage VR2) where switch S3 (Channel 3) is activated to an on state and all other switches S0, S1, and S2 of the selector 410 are off between time T6 and time T7; between time T6 and time T7, switches S43, S44, S51, S52, are all set to a closed state (on); between time T6 and time T7, switches S41, S42, S53, S54, are all set to an open state (off);

Top gain and bottom gain states as discussed above and corresponding calibration circuitry 222 support calibration of the gain associated with the voltage to time converter 210 and corresponding delay line analog-to-digital converter 110. The offset states as discussed above and corresponding calibration circuitry 221 support calibration of the offset associated with the voltage to time converter 210 corresponding delay line analog-to-digital converter 110.

As shown in FIG. 9, and as previously discussed, the calibration circuit 221 produces the corresponding offset calibration signal J1 supplied to the transconductance amplifier A2 based on feedback of monitoring the nodes N41 and N42 during calibration phases. The transconductance amplifier A2 converts the received gain calibration signal J1 into the adjustment signal K3 applied to the amplifier A1. The signal K2 provides offset calibration to the amplifier A1 in corresponding circuitry in FIG. 4.

As further shown in FIG. 9, the calibration circuit 222 produces the corresponding gain calibration signal G1 (gain adjustment control signal) supplied to each of the current starved inverters Z1 and Z2. The gain calibration signal G1 (such as feedback) controls the output slew rate of the current starved inverters Z1 and Z2 generating the respective output signals voutp and voutn. This provides gain calibration to the voltage to time converter 210 and corresponding circuitry in FIG. 4.

In one example, during gain calibration using the calibration circuitry 222, the input to the voltage to time converter 210 is connected to the 4 mV or −4 mV (a.k.a., reference voltage VR1 or reference VR3 which can be any suitable voltage) and the phase error between stop of one delay line and the 4 buffer delayed version of the alternate delay line is reduced. The charge pump (CP1 and CP1) stores the average value of the gain of top and bottom delay lines in the capacitor C1.

During offset calibration, the inputs to the DLFLASH are shorted and the differential outputs of the VTC 410 are compared and a transconductance amplifier A2 differentially adjusts the output of the VTC front-end amp (output of the amplifier A1) to compensate the offset of the VTC (410) and the Delay lines (110).

The delay line analog-to-digital converter 110 can be configured to operate twice within one ADC clock cycle—1st error digitization associated with the received signal 125 and 2nd the gain and offset calibration.

Calibration can be configured to occur in the time when the tracking loop settles to the new DAC code and thus does not slow down the overall ISADC conversion time. So in the 100 Mhz ADC clock rate, 2.5 ns is allocated to the DLFLASH while 7.5 ns is allocated to the ADC tracking loop to settle. For example, the input voltage VSIG settles to a new value between time T82 and T85 for conversion while offset calibration occurs between time T2 and T3. Input voltage VSIG settles to a new value for conversion between time T86 and T90 while offset calibration occurs between time T4 and T5.

The dl_sig_sw signal goes high when start and stop signal are generated. When dl_sig_sw goes high, the inputs to the DLFLASH are switched to the next value.

As shown in FIG. 9, the selector circuit 410 can be configured to interleave conversion of the received analog voltage (such as input vinn and vinp of the amplifier A1) such as an analog error voltage 125 amongst conversions of the first analog gain reference voltage VR1, the second analog gain reference voltage VR2, and the offset reference voltage VR3. In other words, conversion of the first analog gain reference voltage, the second analog gain reference voltage, and the offset reference voltage supports calibration of the signal generator circuit in a manner as previously discussed. In such an example, the analog-to-digital converter circuit and/or the signal generator circuit as discussed herein can be constantly calibrated in between instances of converting the analog error voltage into respective samples of the digital signal. The constant or repetitive function of calibrating the analog-to-digital converter (including the signal generator and/or the delay line analog-to-digital converter circuitry) ensures that the respective samples of the digital signal outputted from the analog-to-digital converter circuitry 110 represent the analog error voltage as accurate as possible.

Figure 10:
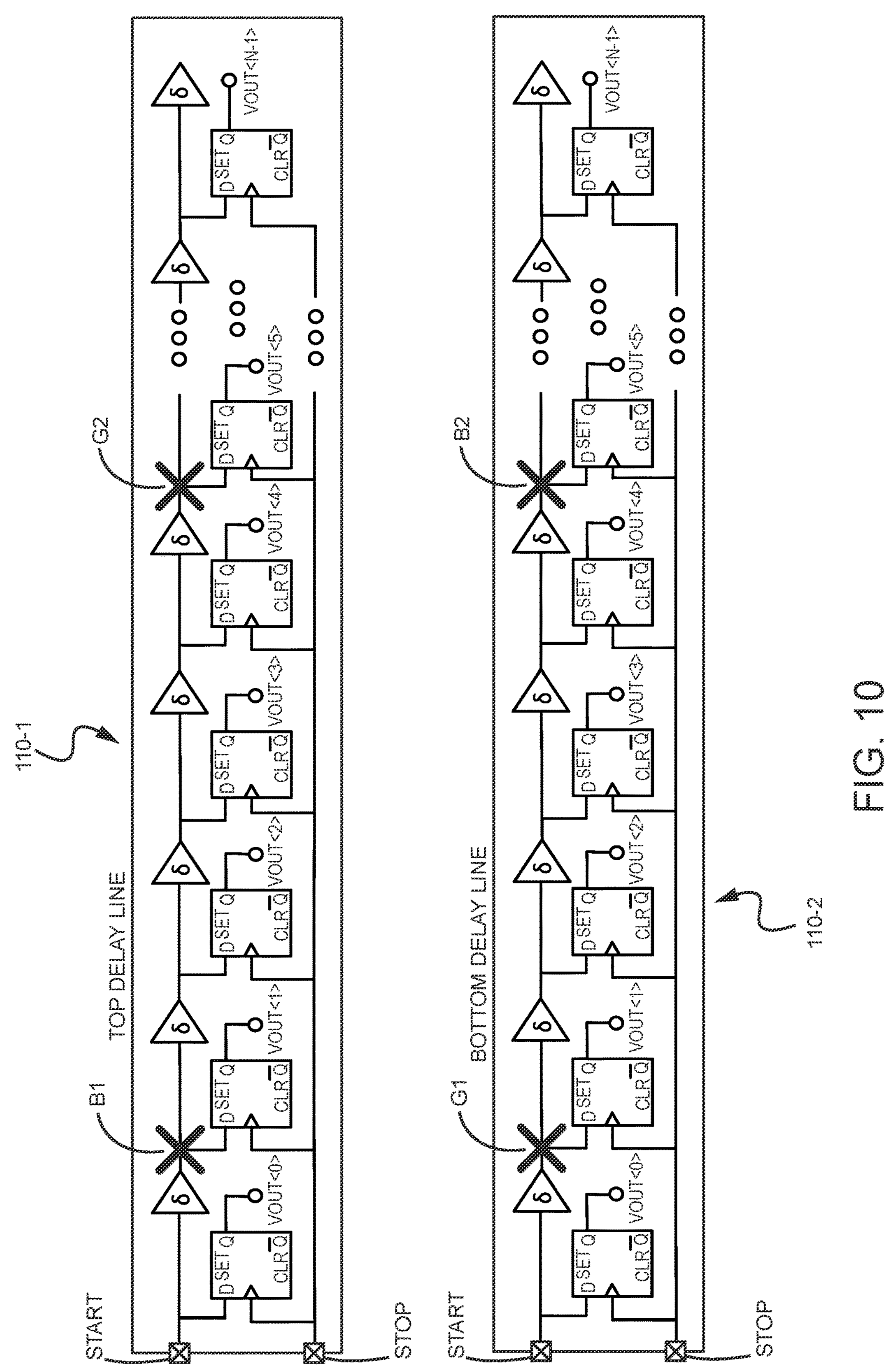
FIG. 10 is an example diagram illustrating tap associated with calibration gain as discussed herein.

FIG. 10 is an example diagram illustrating multiple tap points to calibrate the delay line ADC as discussed herein.

In this example, gain calibration is executed for $\delta sig = tstart - tstop = +/-(N-2)*\delta LSB$ For signal=+4*δLSB, node G1 in the G2 are tapped into the PFD [for top gain calibration].

For signal=−4*δLSB, node B1 and B2 are tapped into the PFD [for bottom gain calibration].

FIG. 11 is an example diagram illustrating implementation of a multiplexer (selector) and corresponding connections for calibration associated with the delay line ADC as discussed herein.

FIG. 11 shows the connections for the calibration of the DLFLASH circuitry as discussed herein. These connections are generated within the ADC tracking loop and provide the +4 mV (reference voltage VR1), −4 mV (reference voltage VR3) for the gain calibration. Because the current sources which generate the references are based on the same bandgap voltage divided by a resistor designed to match the reference, amplification and input resistors and generate the current for the IDAC; and since the references track with the input common mode for the DLFLASH, the references contain the gain error for the tracking loop and the DLFLASH is calibrated to this same gain error which means that no further trimming for the DLFLASH is required.

For offset calibration, the inputs to the DLFLASH are simply shorted. 'dl_sig_sel' from FIG. 9 is the same as 'select' in FIG. 11.

In this example, for each analog-to-digital conversion within one cycle, one of the switches as S0, S1, S2, and S3 is selected by the selector 410 to supply a respective voltage to the node vinn of the amplifier A1 of the voltage to time converter 210. See FIG. 9 for selection of the different states were a respective conversion cycle.

Figure 12:
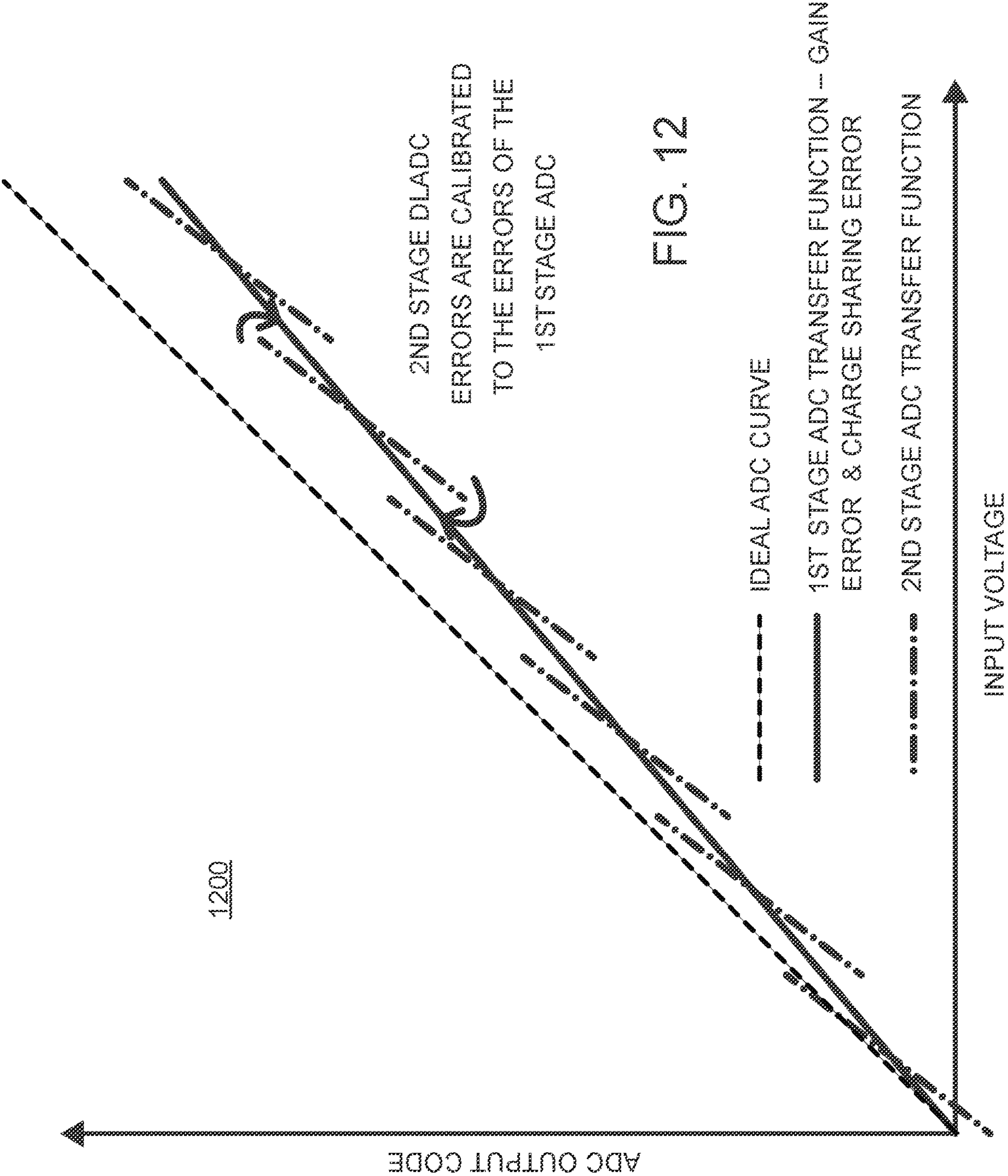
FIG. 12 is an example graph diagram illustrating input voltage versus output voltage code associated with the sub-ranging ADC system as discussed herein.

FIG. 12 is an example graph diagram illustrating input voltage versus output voltage code associated with the sub-ranging ADC system as discussed herein.

More specifically, the graph 1200 and FIG. 12 is an example diagram illustrating the transfer functions of an ideal ADC vs. the transfer function of the 1st stage ADC 155 after the gain error and charge sharing loss. The DLFLASH (such as a delay line analog-to-digital converter circuitry 110) processes the smaller range (lower bits Dout[x−1:0]) of the overall ADC output (all bits Dout[N−1:0]) and so any gain error associated with the delay line analog-to-digital converter circuitry 110 may otherwise create folding point errors when its output is recombined with the 1st stage ADC output (output of the analog-to-digital converter circuitry 155). Because the gain DLL of the DLFLASH (156) calibrates it's gain to reference voltages generated to match the gain errors and charge sharing errors from the 1st stage, implementation of the DLFLASH (analog-to-digital converter circuitry 156) generally eliminates the folding point errors. The advantage of the implementation of the switched capacitor circuit 199 and the corresponding analog-to-digital converter circuitry 156 is that the sub ranging ADC system 100 does not need an intermediary switched cap amplifier circuit implement a subtraction of the mux output from Vin which saves a large amount of power and area. In other words, the switched capacitor converter 199 is implemented as a substitute to a respective amplifier circuit. The switched capacitor converter 199 provides a smaller footprint and reduces overall power consumption with respect to otherwise use of amplifier circuit.

Figure 13:
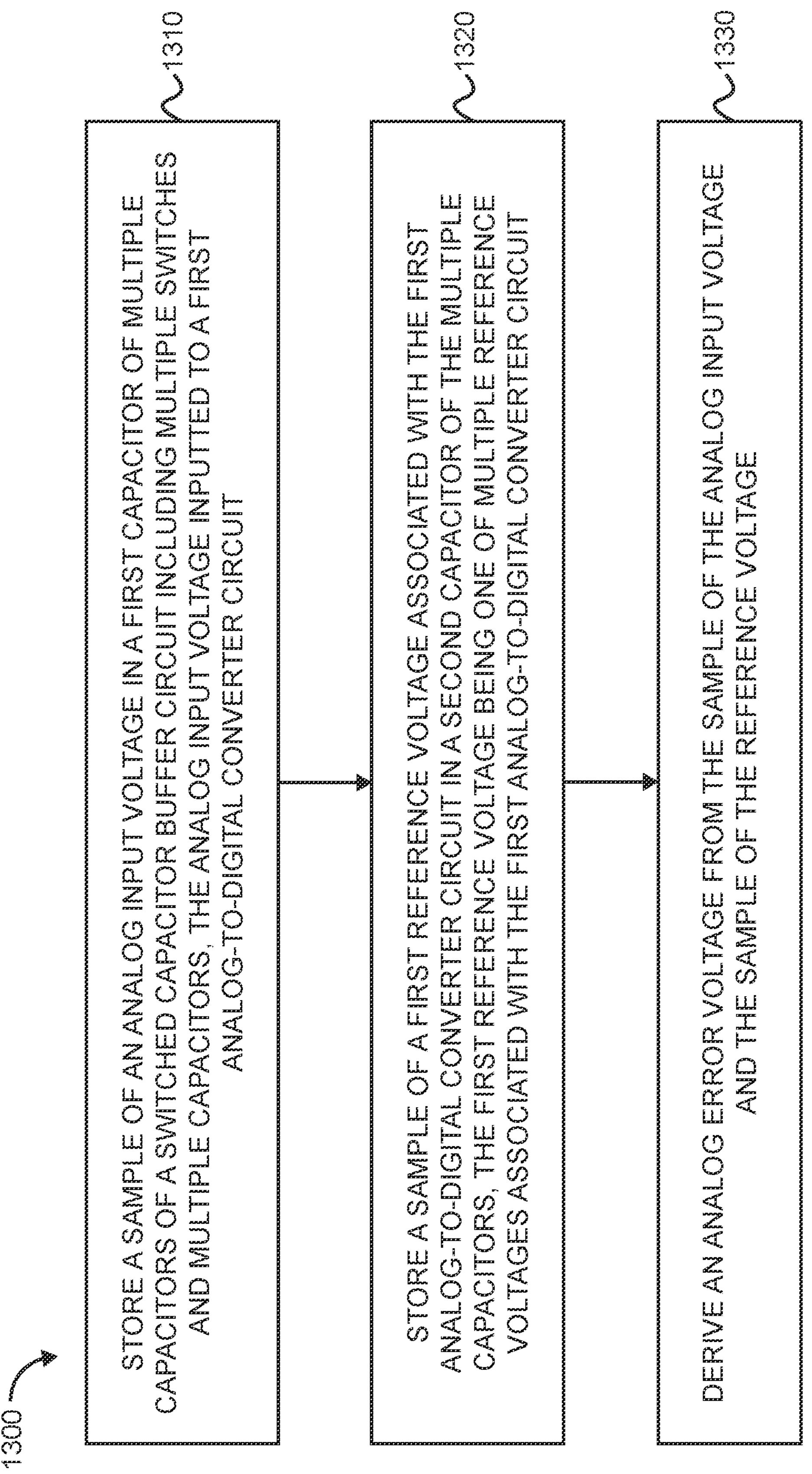
FIG. 13 is an example diagram illustrating a method according to examples herein.

FIG. 13 is an example diagram illustrating a method according to examples herein.

In processing operation 1300, the controller 140 controls switches of the switched capacitor circuit 199 to store a sample of an analog input voltage (such as with respect to a common mode voltage) in a first capacitor of multiple capacitors of a switched capacitor circuit 199 including multiple switches and multiple capacitors. The analog input voltage is inputted to a first analog-to-digital converter circuit.

In processing operation 1320, the controller 140 controls switches of the switched capacitor circuit 199 to store a sample of a first reference voltage (such as with respect to the common mode voltage) associated with the first analog-to-digital converter circuit in a second capacitor of the multiple capacitors. The first reference voltage may be selected from multiple reference voltages associated with the first analog-to-digital converter circuit.

In processing operation 1330, the controller 140 derives an analog error voltage from the sample of the analog input voltage stored in the first capacitor and the sample of the reference voltage stored in the second capacitor.

Note again that techniques herein are well suited for use in circuit applications such as those that implement compensation in a power converter. However, it should be noted that examples herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred examples thereof, it will be understood by those skilled in the art that various changes in form and details may be made therein without departing from the spirit and scope of the present application as defined by the appended claims. Such variations are intended to be covered by the scope of this present application. As such, the foregoing description of examples of the present application is not intended to be limiting. Rather, any limitations to the invention are presented in the following claims.

The invention claimed is:

1. An apparatus comprising:

a switched capacitor circuit including multiple switches and multiple capacitors;

a controller operative to, via control of the multiple switches: i) store a sample of an analog input voltage in a first capacitor of the multiple capacitors, the analog input voltage inputted to a first analog-to-digital converter circuit; ii) store a sample of a first reference voltage associated with the first analog-to-digital converter circuit in a second capacitor of the multiple capacitors; and iii) derive an analog error voltage from the sample of the analog input voltage and the sample of the first reference voltage; and wherein the first reference voltage is selected from amongst multiple reference voltage for storage in the second capacitor depending on a magnitude of the analog input voltage.

2. The apparatus as in claim 1, wherein the first analog-to-digital converter is operative to convert the analog input voltage into a first digital signal via the multiple reference voltages, the multiple reference voltages including the first reference voltage.

3. The apparatus as in claim 2 further comprising:

a digital-to-analog converter coupled between the first analog-to-digital converter and the switched capacitor circuit, the digital-to-analog converter operative to select the first reference voltage from amongst the multiple reference voltages.

4. The apparatus as in claim 3, wherein the first digital signal represents a magnitude of the analog input voltage; and wherein the first reference voltage is selected from amongst the multiple reference voltages for storage in the second capacitor depending on a magnitude of the first digital signal.

5. The apparatus as in claim 1, wherein the controller is further operative to, via control of the multiple switches, output the analog error voltage from the switched capacitor circuit to a second analog-to-digital converter circuit.

6. The apparatus as in claim 5, wherein the second analog-to-digital converter circuit includes:

delay line analog-to-digital converter circuitry;

a signal generator circuit coupled to the delay line analog-to-digital converter circuit, the signal generator circuit operative to produce control signals to control operation of the delay line analog-to-digital converter circuit based upon the analog error voltage received by the signal generator circuit; and calibration circuitry operative to produce calibration signals to calibrate the signal generator circuit.

7. The apparatus as in claim 6, wherein the calibration signals include an offset calibration adjustment signal and a gain calibration adjustment signal;

wherein the calibration circuitry includes an offset calibration circuit operative to generate the offset calibration adjustment signal based on monitoring the control signals produced by the signal generator circuit; and wherein the calibration circuit includes gain calibration circuitry operative to generate the gain calibration adjustment signal based on monitoring an output of the delay line analog-to-digital converter circuit.

8. The apparatus as in claim 1, wherein the first analog-to-digital converter is operative to convert the analog input voltage into a first digital signal, the first digital signal representing a magnitude of the analog input voltage;

wherein the controller is further operative to, via control of the multiple switches, output the analog error voltage from the switched capacitor circuit to a second analog-to-digital converter circuit; and wherein the second analog-to-digital converter is operative to convert the analog error voltage received from the switched capacitor circuit into a second digital signal, the second digital signal representing a magnitude of the analog error voltage.

9. The apparatus as in claim 8 further comprising:

a signal converter operative to generate a third digital signal based on a combination of a first set of set of bits selected from the first digital signal and a second set of bits selected from the second digital signal; and wherein the third digital signal represents a magnitude of the analog input voltage.

10. The apparatus as in claim 1 further comprising:

a second analog-to-digital converter; and wherein the second analog-to-digital converter is a delay line analog-to-digital converter controlled via a voltage to time converter, the voltage to time converter operative to generate control signals to control the delay line analog-to-digital converter based upon a magnitude of the analog error voltage.

11. The apparatus as in claim 1, wherein the controller is operative to, via control of the multiple switches, generate the analog error voltage via control of the multiple switches connecting the first capacitor and the second capacitor in series.

12. The apparatus as in claim 11, wherein the control of the multiple switches connecting the first capacitor and the second capacitor in series is operative to cancel a common mode voltage associated with both the stored sample of the analog input voltage and the stored sample of the first reference voltage.

13. The apparatus as in claim 11, wherein connection of the first capacitor and the second capacitor in series includes directly coupling a first node of the first capacitor to a first node of the second capacitor;

wherein the analog error voltage is a first differential voltage across a second node of the first capacitor and a second node of the second capacitor.

14. The apparatus as in claim 1 further comprising:

a multiplexer circuit operative to select amongst multiple differential input signals to convey to a second analog-to-digital converter circuit, the multiple differential input signals including:

i) a first differential input signal, the first differential input signal being the analog error voltage;

ii) a second differential input signal, the second differential input signal being an offset calibration signal to calibrate the second analog-to-digital converter circuit, the offset calibration signal generated by the first analog-to-digital converter; and iii) a third differential input signal, the third differential input signal being a gain calibration signal to calibrate the second analog-to-digital converter circuit, the gain calibration signal generated by the first analog-to-digital converter.

15. The apparatus as in claim 14, wherein the multiple capacitors include a third capacitor, a fourth capacitor, a fifth capacitor, and a sixth capacitor; and wherein the controller is operative to, via control of the multiple switches, generate the offset calibration signal via control of the multiple switches connecting the third capacitor and the fourth capacitor in series; and wherein the controller is operative to, via control of the multiple switches, generate the gain calibration signal via control of the multiple switches connecting the fifth capacitor and the sixth capacitor in series.

16. The apparatus as in claim 1 further comprising:

a multiplexer circuit coupled to the switched capacitor circuit, the multiplexer circuit operative to select amongst multiple differential input signals to convey to a second analog-to-digital converter circuit.

17. An apparatus comprising:

a first analog-to-digital converter operative to convert a first analog voltage into a first digital signal;

a digital-to-analog converter operative to convert the first digital signal into a second analog voltage;

a switched capacitor circuit coupled to the digital-to-analog converter, the switched capacitor circuit operative to store a sample of the second analog voltage; and a second analog-to-digital converter operative to convert an analog error voltage into a second digital signal, the analog error voltage generated based on a difference between the sample of the second analog voltage received from the switched capacitor circuit and a sample of the first analog voltage.

18. The apparatus as in claim 17, wherein the digital-to-analog converter is a ranging digital-to-analog converter operative to select one of multiple reference values as the sample of the second analog voltage, the sample of the second analog voltage stored in a first capacitor of multiple capacitors.

19. The apparatus as in claim 17 further comprising:

a converter function operative to:

receive a first portion of bits from the first digital signal;

receive a second portion of bits from the second digital signal; and derive an output digital signal from a combination of the first portion of bits and the second portion of bits, the output digital signal indicating a magnitude of the first analog voltage.

20. The apparatus as in claim 17, wherein the second analog-to-digital converter is a delay line analog-to-digital converter circuit.

21. A method comprising:

storing a sample of an analog input voltage in a first capacitor of a switched capacitor circuit including multiple switches and multiple capacitors, the analog input voltage inputted to a first analog-to-digital converter circuit;

storing a sample of a first reference voltage associated with the first analog-to-digital converter circuit in a second capacitor of the multiple capacitors, the first reference voltage being one of multiple reference voltages associated with the first analog-to-digital converter circuit; and deriving an analog error voltage from the sample of the analog input voltage and the sample of the first reference voltage.

22. An apparatus comprising:

a switched capacitor circuit including multiple switches and multiple capacitors;

a controller operative to, via control of the multiple switches: i) store a sample of an analog input voltage in a first capacitor of the multiple capacitors, the analog input voltage inputted to a first analog-to-digital converter circuit; ii) store a sample of a first reference voltage associated with the first analog-to-digital converter circuit in a second capacitor of the multiple capacitors; and iii) derive an analog error voltage from the sample of the analog input voltage and the sample of the first reference voltage;

a second analog-to-digital converter circuit; and wherein the switched capacitor circuit is operative to output the analog error voltage to the second analog-to-digital converter circuit.

23. The apparatus as in claim 22 further comprising:

a signal converter function operative to generate a digital signal based on a combination of a first set of set of bits generated by the first analog-to-digital converter and a second set of bits generated by the second analog-to-digital converter.

24. The apparatus as in claim 23, wherein the digital signal indicates a magnitude of the analog input voltage.

* * * * *